United States Patent
Shenderova et al.

(10) Patent No.: US 12,031,072 B2
(45) Date of Patent: Jul. 9, 2024

(54) METHOD OF PRODUCING FLUORESCENT DIAMOND PARTICLES

(71) Applicants: Olga A. Shenderova, Raleigh, NC (US); Alexander M. Zaitsev, Staten Island, NY (US); Nicholas A. Nunn, Raleigh, NC (US); Marco Diego Torelli, Raleigh, NC (US)

(72) Inventors: Olga A. Shenderova, Raleigh, NC (US); Alexander M. Zaitsev, Staten Island, NY (US); Nicholas A. Nunn, Raleigh, NC (US); Marco Diego Torelli, Raleigh, NC (US)

(73) Assignees: ADAMAS NANOTECHNOLOGIES INC, Raleigh, NC (US); RESEARCH FOUNDATION OF THE CITY UNIVERSITY OF NEW YORK, New York, NY (US)

( * ) Notice: Subject to any disclaimer, the term of this patent is extended or adjusted under 35 U.S.C. 154(b) by 702 days.

(21) Appl. No.: 17/233,843

(22) Filed: Apr. 19, 2021

(65) Prior Publication Data

US 2021/0371741 A1    Dec. 2, 2021

Related U.S. Application Data

(63) Continuation of application No. PCT/US2019/056986, filed on Oct. 18, 2019.
(Continued)

(51) Int. Cl.
*C30B 29/04* (2006.01)
*C01B 32/28* (2017.01)
(Continued)

(52) U.S. Cl.
CPC .............. *C09K 11/65* (2013.01); *C01B 32/28* (2017.08); *C30B 1/02* (2013.01); *C30B 29/04* (2013.01)

(58) Field of Classification Search
CPC ......... C09K 11/65; C01B 32/28; C30B 29/04; C30B 1/00; C30B 1/02; C30B 33/02
See application file for complete search history.

(56) References Cited

U.S. PATENT DOCUMENTS 4,880,613 A    11/1989 Satoh et al.
8,172,916 B2    5/2012 Fujimura et al.
(Continued)

FOREIGN PATENT DOCUMENTS

EP    0351981 A1 *    1/1990
WO    WO-2007027655 A1 *    3/2007    .......... A61K 8/0241

OTHER PUBLICATIONS

Zaitsev, A.M., et al., New Generation of Synthetic Diamonds Reaches the Market Part C: Origin of Yellow Color in CVD-grown Diamonds . . . , Research Gate; Contributions to Gemology, Mar. 2014, pp. 41-55, The City of University of New York, USA.

*Primary Examiner* — Robert M Kunemund
(74) *Attorney, Agent, or Firm* — James G Passe; Passe Intellectual Property, LLC

(57) ABSTRACT

A method of controlled production of luminescent diamond particles exhibiting luminescence in selected specific spectral ranges is provided. The method comprises taking diamond particles containing dopant atoms in the diamond core, irradiating the particles with high energy radiation, and annealing the irradiated diamond particles at a target temperature in the temperature range of about 1400° C.-2200° C. to form luminescent diamond particles where the specific spectral range of luminescence is controlled by the target temperature of the annealing process, the irradiation dose, and the type of dopant atoms. Duration of the annealing and
(Continued)

the temperature ramp up and ramp down times should be short enough to minimize or prevent significant graphitization of the particles. Duration of the temperature ramp up time should be short enough to minimize formation of color centers that might form at temperatures below the target temperature.

35 Claims, 9 Drawing Sheets

Related U.S. Application Data

(60) Provisional application No. 62/747,700, filed on Oct. 19, 2018.

(51) Int. Cl.
  *C09K 11/65* (2006.01)
  *C30B 1/02* (2006.01)

(56) References Cited

U.S. PATENT DOCUMENTS

| | | | |
|---|---|---|---|
| 8,986,646 B2 * | 3/2015 | Twitchen | A44C 17/02 |
| | | | 423/446 |
| 9,689,679 B2 | 6/2017 | Budker et al. | |
| 10,480,097 B2 * | 11/2019 | Twitchen | C30B 25/186 |
| 2004/0229464 A1 * | 11/2004 | Godfried | C30B 9/00 |
| | | | 438/689 |
| 2015/0001422 A1 | 1/2015 | Englund et al. | |
| 2018/0028418 A1 | 2/2018 | Shenderova et al. | |
| 2018/0067056 A1 * | 3/2018 | Simic | C30B 33/02 |

* cited by examiner

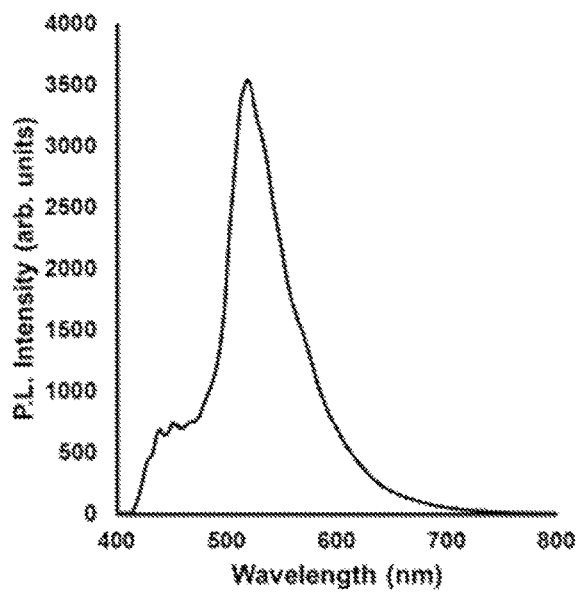
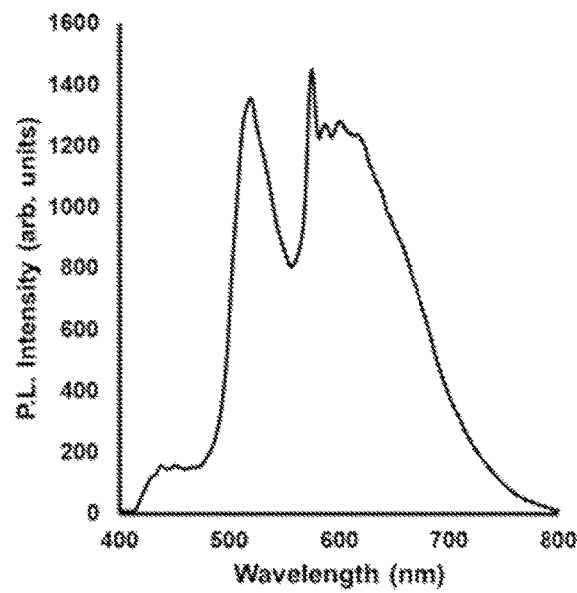
Fig. 1A
Fig. 1B

METHOD OF PRODUCING FLUORESCENT DIAMOND PARTICLES

This application is a national stage continuation application of PCT application number US19/56986 filed on Oct. 18, 2019, which claims priority to U.S. provisional application No. 62/747,700 filed on Oct. 19, 2018 and are all incorporated herein in their entirety by reference.

Funded in part by: Research relating to the technology described herein was sponsored in part by the National Institutes for Health, contract number HHSN26820150001, Jul. 31, 2015-Apr. 30, 2018 and contract number 1R43CA232901-01, Aug. 20, 2018-Jul. 31, 2019. A portion of the research relating to the present technology was not federally sponsored.

COPYRIGHT NOTICE

A portion of the disclosure of this patent contains material that is subject to copyright protection. The copyright owner has no objection to the reproduction by anyone of the patent document or the patent disclosure as it appears in the Patent and Trademark Office patent files or records, but otherwise reserves all copyright rights whatsoever.

BACKGROUND OF THE INVENTION

Field of the Invention

The present invention relates to a method for the production of fluorescent diamond particles. In particular, it is a method of making various color center diamond particles.

Description of Related Art

Optically active crystallographic defects in diamonds are defects in the diamond crystallographic lattice, often associated with non-carbon impurity atoms, which exhibit optical activity such as light absorption, attenuation, scattering, or luminescence. Due to interaction with light, some of these defects cause coloration of diamond crystals and are often called color centers. Some color centers can exhibit luminescence making them luminescent color centers.

Luminescence is the most general term for emission of photons by a substance not resulting from heat, wherein photoluminescence (PL) is a result of photon emission through absorption of photons with different wavelengths than those of the emitted photons. Typically the absorbed photons are at a shorter wavelength than those of the emitted photons; however, for a variety of PL centers in diamond, the excitation wavelength can be longer than the emitted light. Photoluminescence has subcategories of fluorescence (FL) and phosphorescence which are distinctive due to PL lifetime. FL lifetime is approximately at a range of nanoseconds and phosphorescence is approximately milliseconds and longer, correspondingly. However, emission from optically active defects in diamond is quite often due to a combination of a few categories of luminescence, for example, fluorescence, electroluminescence, thermoluminescence, and other categories. Luminescence of diamond particles can be excited by optical radiation.

Currently, more than five hundred optically active centers had been discovered in diamond where the majority of them exhibit luminescent properties. Luminescence in diamond originates from structural defects in the diamond lattice, including their combinations with impurity atoms (dopants). Structural defects are defects including, but not limited to, vacancies (sites where carbon atoms are absent from the crystallographic lattice), self-interstitials (carbon atoms displaced from the lattice sites), complexes of vacancies, complexes of self-interstitials, linear and planar defects, as well as their arrangements with dopants.

Nitrogen is the dominant impurity in the majority of synthetic and natural diamonds. Diamonds described as types Ib, IaA, or IaB contain, respectively, as the major defect, isolated substitutional nitrogen, nearest-neighbor substitutional nitrogen pairs (A centers), or centers comprising four nitrogen atoms surrounding a vacancy (B aggregates). Type-Ib natural diamond is rare, but diamond abrasive grit grown by high pressure, high temperature (HPHT) synthesis (called HPHT diamond) is dominantly type Ib. The growth temperature for this material is typically 1400° C. and Fe, Ni and Co are used as catalysts for the growth. Some natural diamonds are predominantly type IaA and some are predominantly type IaB, but the majority are a mixture of types IaA and IaB.

There are known fluorescent color centers in diamond formed by combined assemblies of lattice vacancies and nitrogen, forming three main color centers: i) a single N atom and a vacancy (V) are responsible for red/near infrared (NIR) fluorescence (NV center); ii) two N atoms adjacent to a vacancy (H3 center) provide green fluorescence; and iii) three N atoms surrounding a vacancy (N3 center) provide blue fluorescence. Diamond samples containing NV centers exhibit a broad emission in the range from about 560 nm to 800 nm, where NV centers with a neutral charge exhibit a zero phonon line (ZPL) at 575 nm, and negatively charged NV centers exhibit a ZPL at 637 nm. The peak emission is around 680 nm under green excitation for samples containing a majority of negatively charged NV centers. H3 center exhibits green fluorescence in the range about 500-600 nm with a peak around 520 nm and N3 center provides blue fluorescence in the range about 410 nm-500 nm with a peak around 420 nm.

Commercial production is mostly centered around fluorescent diamond particles (FDP) with red/NIR emission based on nitrogen-vacancy (NV) centers, which are formed by irradiation with high energy electrons or ions followed by annealing at 800° C.-900° C. of widely available synthetic type Ib particulate diamond containing about 100 ppm-150 ppm of N distributed as single atoms in the diamond lattice. Production of FDP emitting green light based on H3 centers requires the presence of the complexes of two nitrogen atoms in the lattice (A centers). Natural diamonds contain pairs of N atoms at the level of up to 2,000 ppm. For production of FDP containing H3 centers, natural diamond particles had been used by applying irradiation with high energy electrons or ions followed by annealing at 800° C.-900° C. However, using natural diamond for production of FDP with green fluorescence has several drawbacks. Natural diamond from different vendors as a starting material yields green FDP with poor spectral reproducibility because of the high variability of the nitrogen content of the natural diamonds used. In addition, the luminescence of H3 centers in natural diamonds is quenched by surrounding A centers which are present in natural diamond type Ia in large quantities. Because of the difficulty in making such diamond particles, there is a need to provide a controlled process which can produce specific spectral ranges of PL.

BRIEF SUMMARY OF THE INVENTION

The present invention relates to a discovery that the color and fluorescent particles can be manipulated.

Accordingly, in one embodiment, there is a method of processing diamond particles to form a plurality of luminescent diamond particles exhibiting luminescence in specific selected spectral ranges, comprising:
  a. providing diamond particles with sizes below about 100 microns having a surface and a diamond lattice and containing a plurality of impurity atoms in the diamond lattice;
  b. irradiating the diamond particles with high energy species in a dose of about $1\times10^{10}$ species/cm$^2$ to $1\times10^{21}$ species/cm$^2$;
  c. annealing the irradiated diamond particles in at least one of an inert gas environment, vacuum, or hydrogen environment at a target temperature in the temperature range from about 1400° C. to about 2200° C. to form luminescent diamond particles with emission in the specific selected spectral range where the specific spectral range is controlled by the temperature and duration of the annealing process and the irradiation dose;
  d. purifying the irradiated and annealed diamond particles to remove sp$^2$ carbon from the surface of the diamond particles; and
  e. where the luminescence is excited by electromagnetic radiation in the wavelength range comprising at least one selected from the group consisting of optical and X-ray radiation.

Accordingly, in another embodiment, there is a method of processing diamond particles to form a plurality of luminescent diamond particles exhibiting luminescence in specific selected spectral ranges, comprising:
  a. providing diamond particles with sizes below about 100 microns having a surface and a diamond lattice and containing a plurality of nitrogen dopant atoms;
  b. irradiating the diamond particles with high energy radiation species in a dose of about $1\times10^{10}$ species/cm$^2$ to $1\times10^{21}$ species/cm$^2$;
  c. annealing the irradiated diamond particles in at least one of an inert gas environment, vacuum, and hydrogen environment at a target temperature in the temperature range 1400° C.-2200° C. to form luminescent diamond particles with luminescence emission in the specific selected spectral range where the specific spectral range is controlled by the target temperature and duration of the annealing process and the irradiation dose; and
  d. where the luminescence is excited by electromagnetic radiation in the wavelength range comprising at least one selected from the group consisting of optical radiation and X-ray radiation.

In yet another embodiment, there is a plurality of luminescent diamond particles with sizes below about 100 microns having a surface and a diamond lattice and containing nitrogen dopant atoms at concentration below about 200 ppm and at least one non-nitrogen dopant atom, where particles contain a plurality of at least one of H3 centers, N3 centers, a non-nitrogen dopant atom related luminescent centers, and a mixture of the thereof.

In yet another embodiment, there is a method of processing diamond particles to form a plurality of luminescent diamond particles exhibiting luminescence in specific selected spectral ranges, comprising:
  a. providing diamond particles with sizes below about 100 microns having a surface and a diamond lattice and containing a plurality of impurity atoms in the diamond lattice;
  b. irradiating the diamond particles with high energy species in a dose of about $1\times10^{10}$ species/cm$^2$ to $1\times10^{21}$ species/cm$^2$;
  c. annealing the irradiated diamond particles in at least one of an inert gas environment, vacuum, and hydrogen environment at a target temperature in the temperature range 1400° C.-2200° C. to form luminescent diamond particles with luminescence emission in the specific selected spectral range where the specific spectral range is controlled by the temperature and duration of the annealing process;
  d. purifying the irradiated and annealed diamond particles to remove sp$^2$ carbon from the surface of the diamond particles; and
  e. where the luminescence is excited by electromagnetic radiation in the wavelength range comprising at least one selected from the group consisting of optical and X-ray radiation.

In yet another embodiment, there is a plurality of luminescent diamond particles with sizes below about 100 microns having a surface and a diamond lattice and containing nitrogen dopant atoms at concentration below about 100 ppm, where the particles contain a plurality of NV centers and H3 centers and where a difference in luminescence intensity for at least one wavelength over the specific spectral range corresponding to the emission of NV centers measured in the presence and absence of a magnetic field comprises more than about 5%.

Current and prospective applications of luminescent diamond particles include brand protection and anti-counterfeiting, forensic markers, fluorescent paints, fluid tracing, bioimaging and biosensing of external spins and nuclei, and the like. Due to the outstanding mechanical and chemical robustness of the diamond particles, photostability of their luminescence, and inherent biocompatibility, luminescent diamond particles (LDP) are very attractive in industrial and biomedical applications. To facilitate applications of LDPs in industrial and biomedical fields, it is important to provide categories of LDP exhibiting luminescence in different spectral ranges including, but not limited to, ultraviolet (UV), visible, and near infrared (IR) spectral ranges. Within the visible spectral range, it would be advantageous to provide LDP emitting, for example, in major visible wavelength ranges, e.g. in red (about 625 nm-740 nm), orange (about 590 nm-625 nm), yellow (about 565 nm-590 nm), green (about 520 nm-565 nm), cyan (about 500 nm-520 nm), blue (about 435 nm-500 nm), and violet (about 380 nm-435 nm). Specific luminescent visual colors of LDP can be also produced by mixing light emitted from different spectral ranges (e.g. particles with visible yellow emission can be produced based on the presence of two types of color centers within the diamond core, emitting in green and red spectral ranges correspondingly). Ultraviolet spectral range for emitted photons from LDP encompasses about 220 nm to 380 nm, while the infrared spectral range (also called near infrared (NIR)), as used herein, encompasses about 740 nm to 2.5 microns. LDP can also emit a combination of wavelengths from UV, visible, and IR spectral ranges. LDP can be also excited by X-ray radiation.

Much better control of N and other dopants content can be achieved during synthesis of synthetic diamond as compared to natural diamond. Therefore, synthetic diamond particles are much better candidates for production of FDP with green or blue fluorescence or fluorescence in other spectral ranges with well reproducible properties. However, it was not possible to produce green and blue FDP from synthetic type Ib diamond using the traditional approach (e.g. by irradiation with high energy radiation followed by annealing in the 800-900° C. range) since synthetic type Ib diamond does not contain A centers in a sufficient amount to form FDP with a prevalence of H3 centers. Instead, particles with prevalence of NV centers was formed.

In certain embodiments consistent with the invention, compounds and methods are provided to control the luminescence color in commercial type Ib HPHT diamond powder. In one embodiment, the method comprises taking powder irradiated with high energy radiation and performing rapid thermal annealing (RTA) for a few minutes at a predetermined high temperature (within about the 1400° C.-2200° C. range) depending on the desired luminescent color. RTA technology with minute-level temporal control prevents substantial material graphitization which otherwise easily happens with particulate diamond. Examples below illustrate results of systematic experiments performed by varying RTA temperature in the process between about 500° C. and 2200° C. at an annealing time of a few minutes or longer and monitoring luminescent color and PL spectra of the powder. In other embodiments, the role of the irradiation fluence, nitrogen content of the starting synthetic diamond powder, and presence of non-carbon dopant have been demonstrated.

In certain embodiments consistent with the invention, starting with the same Ib type diamond particles, FDP with dominant emission in red, green, or blue regions were produced depending on the processing conditions. Luminescent particles with dominant emission, as used herein, are defined as follows: under particular excitation wavelengths from the range about 190 nm to 2.5 micron, FDP exhibits PL spectra, which can have peaks in different spectral ranges associated with different types of color centers present in the particles. Within every specific emission range associated with a specific type of color center, the PL spectral profile has a peak or a plateau where the intensity has a maximum value. The spectral region with the dominant emission, as used herein, is a region where the maximum PL intensity value exceeds maximum values of PL intensity in other spectral regions for other peaks by at least about 3 times. Otherwise, it is considered that FDP exhibiting a few emission peaks in the spectra displays dominant emission in a few specific spectral regions.

According to certain embodiments consistent with the present invention, the annealing time has to be very short, only one or a few minutes, in order to avoid substantial graphitization (e.g. more than 50% of the initial particles mass) or even full graphitization depending on the target annealing temperature and particle sizes. It was highly surprising that 20-micron particles annealed in a hydrogen atmosphere were able to withstand within about 1-3 minutes annealing at temperatures from the range about 2000° C.-2200° C. without complete graphitization. The level of graphitization can be defined from mass difference between starting diamond particles before annealing and particles after annealing and oxidation/etching of the graphitic phase formed during annealing. Oxidation can be done in an ozone atmosphere as known in the art, in air (heating at 500° C.-600° C.), or using oxidizing acids (e.g. a mixture of nitric and sulfuric acids). Etching of the graphitic phase can be done in a hydrogen atmosphere at 600° C.-900° C.

According to certain embodiments consistent with the present invention, synthetic type Ib diamond particles with micron sizes and synthetic nanodiamond particles were irradiated with high energy electrons to different doses and annealed at temperatures 1400° C.-2200° C. which are much higher as compared to the temperature used in the art for electron/ion irradiated diamond particles for production of NV centers with red/NIR luminescence (about 800° C.-900° C. range). By varying the target annealing temperature, it was highly surprising to observe particles emitting dominating red, green, or blue PL under UV excitation when the target annealing temperature was increased within the range of about 1400° C. to 2200° C. As will be seen in the experimental data, by using the RTA approach, it is possible to produce particles with dominating emission with well pronounced peaks/shoulders in the PL spectra in about 570 nm-750 nm, 500 nm-570 nm, and 400 nm-500 nm ranges depending on the target annealing temperature used. For other annealing temperatures, it was possible to produce particles with dominant emission with pronounced peaks/shoulders in two or even three spectral ranges. Particles with bright yellow, pink, orange, purple, and turquoise fluorescence were produced. The dominant emission in the three ranges (red, green, and blue) was attributed to formation of nitrogen-related color centers: NV, H3, and N3 centers and Ni-related color centers (emission range about 510 nm to about 600 nm). Emission in the 750 nm-1000 nm spectral range was also observed and attributed to Ni-related color centers. Concentration of Ni in diamond particles can be below about 10,000 ppm, specifically below about 6,000 ppm. Ni content reported by producers of HPHT diamond is typically in the range between about 1,000 ppm and 10,000 ppm.

According to certain embodiments consistent with the present invention, it was concluded that annealing of the irradiated synthetic type Ib powder at moderate temperatures (about 800° C.-1500° C.) creates a high concentration of NV defects, while treatments at temperatures above about 1500° C. cause the formation of H3 defects. The annealing at temperatures above about 1900° C. leads to the formation of N3 centers. The change in the defect composition causes a visible change in the luminescence color of the diamond powder under UV excitation. It has been found that specific RTA annealing temperatures in the process yield uniform and predictable specific luminescence colors. RTA treatments at temperatures above about 1800° C. yield uniformly bright green luminescence of the entire powder due to formation of a majority of H3 centers. Green luminescence can be attributed to both H3 centers as well as centers related to nickel impurities when a Ni dopant is present in the diamond core. Ni can affect N diffusion at high temperatures and enhance formation of A centers (pairs of N atoms). Thus, Ni may contribute to enhanced production of H3 centers. Ni-related complexes with N also have strong green PL on their own. Highly homogeneous luminescence among diamond particles emitting red, green, or blue luminescent therefore can be reproducibly created at the established RTA temperature intervals.

According to certain embodiments consistent with the present invention, it was observed that high electron irradiation fluence (e.g. $5 \times 10^{19}$ e/cm$^2$) significantly enhances blue luminescence after rapid high temperature treatment. 20-micron particles irradiated to a dose of $5 \times 10^{19}$ e/cm$^2$ and subsequently annealed at 2100° C. resulted in particles demonstrating bluish PL with two dominant peaks in the ranges 400 nm-500 nm and 500 nm-570 nm. For particles irradiated to a lower dose (e.g. $1 \times 10^{19}$ e/cm$^2$), similar annealing resulted in luminescence with a more pronounced peak in the 500 nm-570 nm range than the peak in the 400 nm-500 nm range.

According to other embodiments consistent with the present invention, following rapid thermal annealing of a sample with a high starting N concentration (about 800 ppm) irradiated to a dose $3\times10^{18}$ e/cm$^2$ and annealed at 1900° C. for 5 minutes, strong green luminescence was observed. Surprisingly, relatively strong green luminescence was induced by RTA at 1900° C. even without irradiation of a high-N content sample which was also rich in Ni dopant.

Surprisingly, 100 nm irradiated type Ib diamond powder withstands RTA treatment at 1800° C. for 2 minutes. As will be seen in the experimental data, FND particles with bright green luminescence were obtained, exceeding by about an order of magnitude the brightness of traditionally produced green luminescence particles from natural diamond.

According to certain embodiments of the present invention, production of diamond particles with green and blue luminescence from synthetic diamond powder with well reproducible properties became possible due to the use of an advanced RTA technique which allows either diffusion of only point defects (vacancies and interstitials), or point defects and N atoms concurrently, depending on the annealing temperature, which can be reached within minutes. Not being bound by theory, the following hypothesis can be applied to the observed results. In the type Ib diamond, N is distributed as single atoms. Therefore, at RTA temperatures within about 800° C.-1500° C. intervals, vacancies diffuse and efficiently produce NV centers. For formation of H3 and N3 centers, assemblies of 2 and 3 N atoms should be formed. Therefore, N diffusion is required to form complexes of a few N atoms. It is accepted that N diffusion starts at around 1500° C. Simultaneously, vacancies should be also available to form color centers with the complexes of 2 and 3 N atoms. It is also accepted that vacancies and interstitials can enhance N diffusion. In the commonly used furnaces, however, with relatively long temperature lag-times, vacancies start to move at temperature above about 600° C. and are either trapped by N atoms forming thermally stable NV assemblies or are annihilated, for example, at the particles surfaces. Therefore, by the time the temperature reaches about 1500° C. and higher in the commonly used furnaces, there is no substantial amount of vacancies remaining available to support formation of H3 and N3 assemblies. Moreover, nano-sized diamonds are easily graphitized at temperature exceeding about 800° C. Thus, using traditional technology, synthetic diamonds with single N atoms at the level of about 100 ppm can be used only for production of NV-based red/NIR FND. This was confirmed in the control experiments when an electron irradiated sample was annealed at 850° C. for 1 hour in a regular furnace (NV centers were formed and vacancies annihilated) and then RTA was performed at 1900° C. As compared to the irradiated sample which was treated using the same conditions in a RTA furnace without intermediate annealing, the sample with the intermediate annealing at 850° C. showed highly non-uniform yellowish-greenish luminescence and the presence of both NV and H3 centers in the spectra was observed. Comparatively, the RTA-treated sample without intermediate annealing showed uniform bright green fluorescence from the particles and the presence of H3 centers dominated the spectra.

According to certain embodiments of the present invention, as opposed to commonly used furnaces, an RTA furnace provides the capability to treat diamond particles at temperatures exceeding 1500° C. without substantial graphitization with minute-level temporal control. Rapid heating of the samples creates conditions where high concentrations of mobile vacancies, interstitials, N atoms, and other dopants coexist providing favorable conditions for formation of specific types of color centers at a specific target temperature at a predetermined duration of annealing. Other factors that specifically facilitate formation of blue luminescent centers by enhancing N aggregation are longer annealing time, higher irradiation dose (enhanced N diffusion through vacancies or interstitial-assisted mechanisms), and increased concentration of N in the starting synthetic diamond.

According to certain embodiments of the present invention, the synthetic diamond particles can be produced by at least one of the methods selected from the group consisting of detonation, shock wave, chemical vapor deposition (CVD), laser ablation of carbon containing precursors, ultrasonic treatment of carbon containing precursors, nucleation of diamond powder in the gas phase, ion irradiation of graphite, chlorination of carbides, high-pressure-high-temperature diamond synthesis, or other known methods. Macroscopic diamond samples can be fragmented into smaller size diamond particles by milling or other means. One of the surprising observations during RTA treatment of a CVD diamond polycrystalline film was fragmentation of the film into individual grains at high temperature treatment exceeding about 1800° C. After purification of the sample in hydrogen followed by oxidation treatment, individual micron-sized luminescent particles were observed in a fluorescent microscope. Diamond particles can be doped during synthesis by adding doping elements into carbon precursor, into cooling media for the detonation method or laser ablation method, or to a feed gas during CVD growth, as well as through post-synthesis treatment by incorporating doping elements by ion implantation or other known methods.

Thus, in accord with certain embodiments consistent with the present invention, a method of processing diamond particles to form a plurality of luminescent diamond particles exhibiting luminescence in specific selected spectral ranges involves the steps of providing diamond particles with sizes below about 100 microns having a surface and a diamond lattice and containing a plurality of impurity atoms in the diamond lattice; irradiating the diamond particles with high energy species in a dose of about $1\times10^{10}$ species/cm$^2$ to $1\times10^{21}$ species/cm$^2$; annealing the irradiated diamond particles in at least one of an inert gas environment, vacuum, or hydrogen environment at a target temperature in the temperature range from about 1400° C. to about 2200° C. to form luminescent diamond particles with emission in the specific selected spectral range where the specific spectral range is controlled by the temperature and duration of the annealing process and the irradiation dose and where the luminescence is excited by electromagnetic radiation in the wavelength range comprising at least one selected from the group consisting of optical and X-ray radiation. The specific selected spectral ranges correspond to emission spectral ranges of at least one of the luminescent centers formed by an impurity atom and a vacancy; at least two impurity atoms and a vacancy; and a combination thereof. The optical radiation for excitation comprises wavelengths from the range about 190 nm to 2000 nm, while the X-ray radiation comprises wavelengths from the range about 0.01 nm to about 10 nm. The irradiating comprises at least one species selected from the group consisting of irradiating with high energy electrons, protons, ions, neutrons, and gamma rays. The irradiating with electrons comprises electrons having energy between about 300 keV and about 10 MeV providing irradiation dose between about $1 \times 10^{16}$ e/cm$^2$ to $1 \times 10^{21}$ e/cm$^2$. The annealing comprises ramping up to reach the target temperature at a sufficient rate to avoid (or minimize) formation of color centers formed at a temperature below the target temperature and contributing to formation of a variety of types of color centers and to luminescence spectral inhomogeneity. Irradiation and annealing steps can alternate more than one time. For example, a sample can be first annealed, then irradiated and annealed again. In one embodiment, the time to reach the target temperature is selected to be short enough to prevent significant graphitization of the particles and minimize formation of unwanted color centers forming at temperatures below the target temperature. Specifically, the time to reach the target temperature can be shorter than about 10 minutes. In another embodiment, after an irradiation step the irradiated diamond particles can be first annealed in at least one of an inert gas environment, vacuum, or hydrogen environment at a target temperature below approximately 1400° C. forming NV centers and then steps of annealing at a target temperature in the range of 1400° C. to 2200° C. to form coexistence of NV centers and centers containing two and more N atoms can be performed. After annealing, the irradiated and annealed diamond particles are purified to remove sp$^2$ carbon from the surfaces of the diamond particles. In one embodiment, the diamond particles purified from sp$^2$ carbon are functionalized with at least one functional group selected from the group consisting of carboxylic, hydroxyl, amino, hydrogen, epoxy, polyethylene glycol, hydrocarbon chain, hydrocarbon, aromatic, nucleophile, thiol, sulfur, acid, base, halogen and fluoro-containing. In another embodiment, the diamond particles purified from sp$^2$ carbon are attached to or conjugated with at least one material selected from the group consisting of biological molecules, a nucleic acid, a protein, an antibody, a ligand, a dye, a fluorescent specie, a radioactive specie, a paramagnetic specie, an image contrast agent, an isotope, a drug molecule, and a polymer. The luminescent diamond particles can be incorporated into a cell, organism, tissue, matrix, or a substrate.

In one embodiment, in a method of processing diamond particles to form a plurality of luminescent diamond particles exhibiting luminescence in specific selected spectral ranges, the step of providing diamond particles with sizes below about 100 microns having a surface and a diamond lattice encompass particles containing a plurality of nitrogen dopant atoms wherein the concentration of nitrogen dopant atoms is below about 200 ppm, 100 ppm, or 50 ppm. For example, concentration of nitrogen dopants in diamond samples can be as low as 10 ppm, 20 ppm, 30 ppm, or 40 ppm. In accord with certain embodiments consistent with the present invention, a method of processing diamond particles to form a plurality of luminescent diamond particles exhibiting luminescence in specific selected spectral ranges comprise the steps of providing diamond particles with sizes below about 100 microns having a surface and a diamond lattice and containing a plurality of nitrogen dopant atoms and at least one non-nitrogen dopant; annealing the irradiated diamond particles in at least one of an inert gas environment, vacuum, and hydrogen environment at a target temperature in the temperature range 1400° C. to 2200° C. to form luminescent diamond particles with emission in a specific selected spectral range where the specific spectral range is controlled by the target temperature and duration of the annealing process and the type of dopant atoms and where the luminescence is excited by electromagnetic radiation in the wavelength range comprising at least one selected from the group consisting of optical and X-ray radiation.

In accord with certain embodiments consistent with the present invention, a method of processing diamond particles to form a plurality of luminescent diamond particles exhibiting luminescence in specific selected spectral ranges comprise the steps of providing diamond particles with sizes below about 100 microns having a surface and a diamond lattice, and containing more than one dopant atom; creating at least one vacancy in the diamond particles by irradiating the diamond particles with high energy radiation; annealing the irradiated diamond particles in at least one of an inert gas environment, vacuum, and hydrogen environment at a target temperature in the temperature range 1400° C. to 2200° C. to form luminescent diamond particles with luminescence emission in the specific selected spectral range where the temperature is selected to fall within the range that causes formation of a plurality of specific luminescent color centers comprised of at least one vacancy with at least one dopant atom; and wherein the ramp up time to the target temperature is about ten minutes or less. In another embodiment, the annealing is done in a hydrogen environment and the total duration of the combination of ramp up time, annealing time at the target temperature, and the ramp down time is about 10 minutes or less.

In accordance with certain embodiments consistent with the present invention, the method of processing diamond particles to form luminescent diamond particles comprises the target temperature which facilitates the formation of a plurality of H3 luminescent color centers, wherein the target temperature is a temperature above about 1700° C. In another embodiment, the target temperature is selected to cause the formation of a plurality of N3 luminescent color centers, wherein the target temperature is a temperature above about 1900° C. In yet another embodiment, the target temperature facilitates the formation of a plurality of nickel-containing luminescent color centers. In yet another embodiment, the target temperature is selected to cause the formation of at least one of NV, H3, N3, Ni-containing luminescent color centers, or a mixture thereof.

In accordance with certain embodiments consistent with the present invention, the method of processing diamond particles to form luminescent diamond particles comprises the diamond particles containing less than about 1000 ppm of nitrogen, 200 ppm of nitrogen, or 100 ppm and even more specifically below about 50 ppm. In another embodiment, the non-nitrogen dopant atoms are nickel. In yet another embodiment, the dopant is selected from the group consisting of N, Ni, Co, a transition metal, carbon isotope, non-carbon isotope, 19F, 15N, a rare earth element, a noble gas atom, Sn, Ag, Tl, Zn, Si, and Ge. In another embodiment, diamond particles can be enriched with 13C.

In accordance with certain embodiments consistent with the present invention, the produced luminescent diamond particles exhibit luminescence in specific selected spectral ranges, wherein the specific spectral range falls within the range between about 220 nm to 1100 nm and is selected from the group comprising ultraviolet, visible colors, and near-infrared spectral ranges.

One of the embodiments of the present invention comprises a plurality of luminescent diamond particles with sizes below about 100 microns having a surface and a diamond lattice, and containing nitrogen dopant atoms at concentration below about 200 ppm and at least one non-nitrogen dopant atom, where particles contain a plurality of at least one of H3 centers, N3 centers, a mixture of the thereof and non-nitrogen dopant atom related luminescent centers. In another embodiment, the plurality of luminescent diamond particles further comprises a plurality of NV centers.

Another embodiment of the present invention comprises method of processing diamond particles to form luminescent diamond particles exhibiting luminescence in specific selected spectral ranges, further comprising while exciting luminescence by electromagnetic radiation, applying a magnetic field to the particles and monitoring difference in luminescence intensity in the specific spectral range corresponding to the emission of NV centers as compared to the luminescence intensity measurements without magnetic field by at least one of the modes of collection of photons, including, but not limited to, acquiring spectra and using an imaging device. In another embodiment, the difference in luminescence intensity is more than approximately 5% for at least one emission wavelength from the specific spectral range corresponding to the emission of NV centers.

Certain embodiments of the present invention comprise plurality of luminescent diamond particles with sizes below about 100 microns having a surface and a diamond lattice and containing nitrogen dopant atoms at concentration below about 100 ppm, where the particles contain a plurality of NV centers and at least one of H3 centers, N3 centers, SiV and Ni-related color centers and where a difference in the luminescence intensity for at least one wavelength from the specific spectral range corresponding to the emission of NV centers measured in the presence and absence of a magnetic field comprises more than about 5%. The luminescence intensity of H3 centers is not changed with the presence of a magnetic field as compared to the intensity measured without magnetic field. According to other embodiments, the plurality of luminescent diamond particles containing a plurality of NV centers and H3 centers demonstrate the difference in the emission luminescence intensity in the absence or presence of the magnetic field for a field of at least about 100 Gauss. Moreover, the ratio between the maximum luminescent intensity for H3 centers and maximum luminescence intensity for NV centers is different in the presence and absence of a magnetic field and where the luminescence is excited by wavelengths from UV to NIR spectral regions and more specifically by wavelength from blue, green, yellow, and orange spectral ranges. According to another embodiment, the plurality of these luminescent diamond particles is further combined with a cell, organism, organ, tissue, fluid, matrix or a substrate, where the substrate is electronic component, a tag, a tracer, a label, a polymer, and an optically transparent solid.

BRIEF DESCRIPTION OF THE DRAWINGS

FIG. 1a and FIG. 1b show an illustration of the role of temperature, dose and ramp up process in the RTA process for HPHT diamond particles in formation of bluish fluorescence.

DETAILED DESCRIPTION OF THE INVENTION

Figure 2:
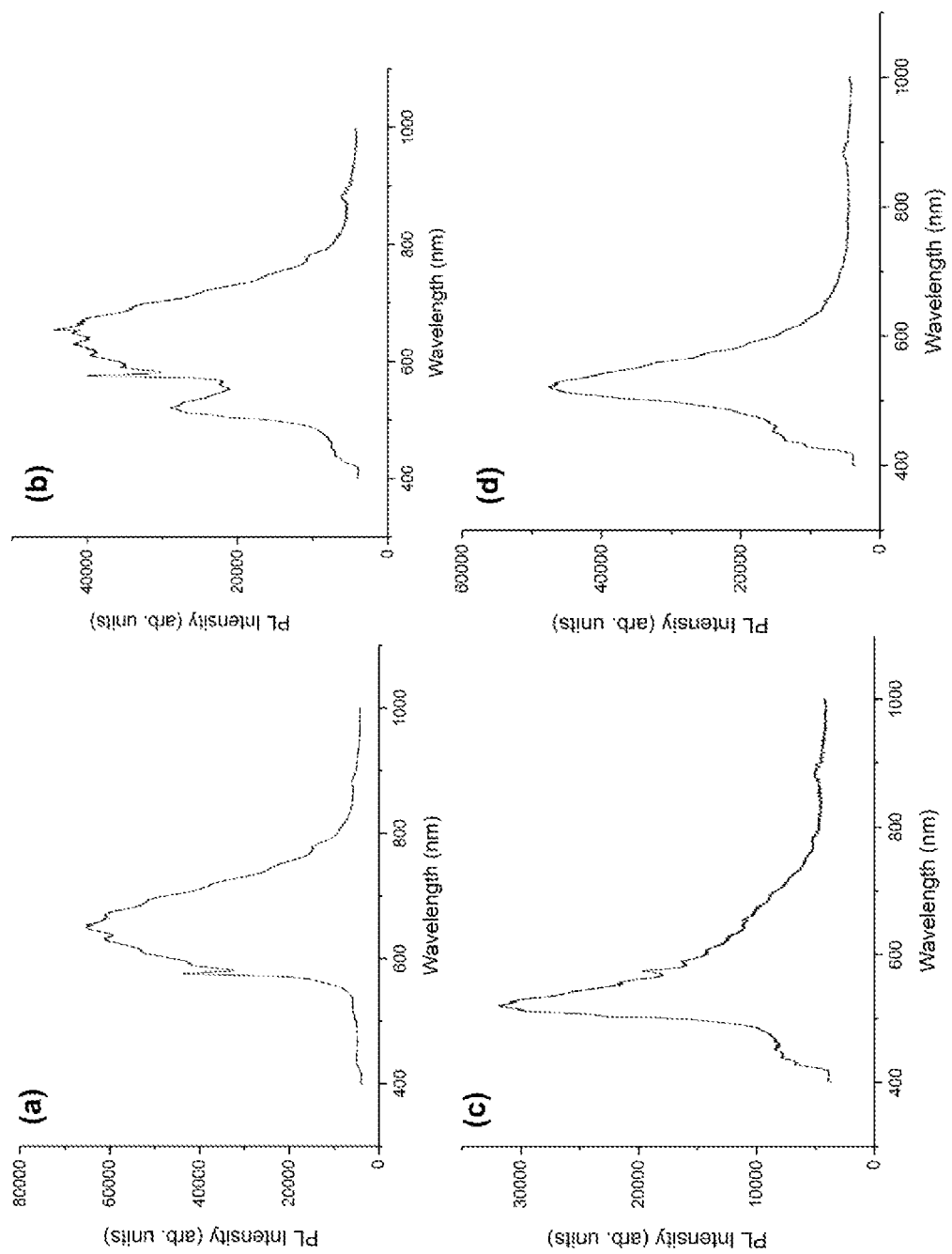
FIG. 2 is an illustration of the role of temperature in the RTA process in formation of red luminescence, a mixture of red and green luminescence, green luminescence, and a mixture of green and blue luminescence.

While this invention is susceptible to embodiment in many different forms, there is shown in the drawings, and will herein be described in detail, specific embodiments with the understanding that the present disclosure of such embodiments is to be considered as an example of the principles and not intended to limit the invention to the specific embodiments shown and described. In the description below, like reference numerals are used to describe the same, similar, or corresponding parts in the several views of the drawings. This detailed description defines the meaning of the terms used herein and specifically describes embodiments in order for those skilled in the art to practice the invention.

Definitions

The terms "about" and "essentially" mean±10 percent.

The terms "a" or "an", as used herein, are defined as one or as more than one. The term "plurality", as used herein, is defined as two or as more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

The term "comprising" is not intended to limit inventions to only claiming the present invention with such comprising language. Any invention using the term comprising could be separated into one or more claims using "consisting" or "consisting of" claim language and is so intended.

Reference throughout this document to "one embodiment", "certain embodiments", "an embodiment", or similar terms means that a particular feature, structure, or characteristic described in connection with the embodiment is included in at least one embodiment of the present invention. Thus, the appearances of such phrases in various places throughout this specification are not necessarily all referring to the same embodiment. Furthermore, the particular features, structures, or characteristics may be combined in any suitable manner in one or more embodiments without limitation.

The term "or", as used herein, is to be interpreted as an inclusive or meaning any one or any combination. Therefore, "A, B, or C" means any of the following: "A; B; C; A and B; A and C; B and C; A, B, and C". An exception to this definition will occur only when a combination of elements, functions, steps, or acts are in some way inherently mutually exclusive.

The drawings featured in the figures are for the purpose of illustrating certain convenient embodiments of the present invention and are not to be considered as limitation thereto.

The term "means" preceding a present participle of an operation indicates a desired function for which there is one or more embodiments, i.e., one or more methods, devices, or apparatuses for achieving the desired function and that one skilled in the art could select from these or their equivalent in view of the disclosure herein, and use of the term "means" is not intended to be limiting.

As used herein, the term "nanodiamond or diamond nanoparticles" refers to submicron sized particles. More specifically, the term nanodiamond particles refers to discrete diamond particles exhibiting at least one spatial dimension having a size of less than about 1000 nm. More commonly, the nanodiamond particles exhibit multiple spatial dimensions having a size of less than about 1000 nm.

As used herein, the term "micron-diamond or micron diamond particle" refers to discrete diamond particles exhibiting at least one spatial dimension having a size ranging from about 1 micron ($\mu$m) to 500 $\mu$m. More commonly, a micron diamond particle exhibits multiple spatial dimensions having a size of about 1 $\mu$m to 500 $\mu$m (0.5 mm).

As used herein, the term "FND" refers to fluorescent nanodiamond, a diamond nanoparticle exhibiting fluorescence.

As used herein, the terms "primary particle size" (PPS) and "diamond particles" refer to the present invention utilization of nanoparticles or micron particles of diamond below about 100 microns. PPS is the size of a smallest primary structure in a system exhibiting a contiguous crystalline structure. The size distribution of primary particles is typically rather narrow and depends on the particle synthesis and processing conditions. Most suppliers of nanoparticles list only primary particle size in their product specification. This particle size is typically defined from X-ray diffraction pattern, Scanning-Electron Microscopy (SEM) images, High-Resolution Transmission-Electron Microscopy (HR-TEM) images, or calculated from Brunauer, Emmett and Teller (BET) surface area measurements. However, the primary particles can form aggregates or agglomerates due to their high surface energy or fabrication/processing conditions. The size of the aggregates is referred to as the "aggregate" or "agglomerate" size herein to clearly call out the distinction. The term "particle size" (PS) is used to generically refer to either PPS or agglomerate size or a size of a combination of agglomerates and primary particles. Particles consisting of closely packed primary particles and exhibiting minimum porosity are often called polycrystalline diamond particles.

Agglomerate size can be measured in a number of ways (e.g., SEM for dry powder forms or unimodal analysis of photon correlation spectroscopy data for relatively transparent solutions) and often can be tens or hundreds of times bigger than the PPS.

As used herein, the term "particle size", as defined above, can refer to either primary particle size or the agglomerate size or a combination of primary particles and agglomerates. For clarity, "primary particle size" or "agglomerate size" will be explicitly called out when appropriate.

As used herein, the term "nanodiamond" or "diamond nanoparticles" is used for submicron sized particles and may include both or either primary particles and particles formed by agglomerates of the primary particles.

Particle size and agglomerate size can be measured by means known in the art. The present inventors measured size in a variety of ways including using unimodal analysis of photon correlation spectroscopy (in this case, by setting the spectroscope to provide output in the unimodal mode) for dispersions in clear liquids. This measurement technique is rapid and has been found to yield consistent measurements compared to other techniques, and thus, measurements presented herein are based upon such measurement when relatively transparent liquids are analyzed, but other standard measurement techniques (e.g., SEM, HRTEM, and BET) will yield similar results and can also be used when such techniques are more suitable.

As used herein, the terms "dopant" and "impurity" refer to non-carbon elements present in the diamond lattice. These terms are used interchangeably. As used herein, the dopant (impurity) relate to those elements which contribute to luminescence when corresponding color centers are formed (such as complexes of the dopants (impurities) with intrinsic defects (e.g. vacancies or carbon interstitials)). Examples of doping elements that can contribute to luminescence when present in the diamond lattice in different structural arrangements may include, but are not limited to, Ni, Co, a transition metal, a rare earth element, a noble gas atom, Sn, Ag, Tl, Zn, Si, and Ge. The diamond lattice also contains carbon isotopes (e.g. 1.1% of C13 isotope) or nitrogen isotopes in a natural content, or carbon and nitrogen isotopes that can be introduced deliberately. Isotopes of other doping elements besides C and N can be also introduced into the diamond lattice.

As used herein, the terms "annealing" and "annealing time" refer to the process and time by which diamond particles are elevated to high temperature sufficient to facilitate thermally activated movement of atomic species (e.g., dopant atoms and/or vacancies) within the diamond lattice.

As used herein, the term "irradiating with high energy" refers to bombardment of either particulate or bulk diamond with energetic species (e.g., electrons, protons, ions, or neutrons) with sufficient energy to displace carbon atoms within the diamond crystalline lattice. More specifically, this refers to electron beam having energies ranging from about 1 MeV to 10 MeV.

As used herein, the term "environment" refers to the vacuum/gaseous surroundings of the diamond particulate during annealing. More specifically, this environment may consist of either vacuum, hydrogen, or inert gases such as nitrogen.

As used herein, the term "target temperature" refers to the desired annealing temperature to facilitate the formation of specific crystallographic defect centers within the diamond lattice. This temperature may be selected to promote the thermally activated motion of single atomic constituents or the simultaneous motion of a plurality of atomic constituents within the diamond lattice.

As used herein, the term "specific spectral range" refers to the primary luminescence emission range associated with specific crystallographic defects within the diamond lattice. More specifically, this refers to the wavelength range of luminescence emission associated with specific crystallographic defects within the diamond lattice. For example, the nitrogen-vacancy (NV) defect center in diamond may be said to have a "specific spectral range" of about 570 nm to 800 nm.

As used herein, the term "luminescence" refers to the emission of electromagnetic radiation from crystallographic defects within the diamond lattice upon absorption of radiative energy from an appropriate excitation source of electromagnetic radiation. More specifically, luminescence refers to emission of ultraviolet (UV), visible, or near-infrared (NIR) electromagnetic radiation from crystallographic defects within the diamond lattice following absorption of UV, visible, NIR, or X-Ray electromagnetic radiation.

As used herein, the term "electromagnetic radiation" refers to the propagating waves of electric and magnetic waves carrying radiative energy through space. More specifically, this term refers to the radiative energy necessary to promote luminescence emission from crystallographic defects centers within the diamond lattice, and may consist of ultraviolet, visible, infrared, or X-rays.

As used herein, the term "purifying the irradiated and annealed diamond particles" refers to the processes necessary to remove non-diamond carbon from the diamond particles following annealing treatments. More specifically, the term refers to the removal of graphitic or amorphous carbon from the surfaces of diamond particles following annealing, and may consist of treatment in hydrogen, ozone, air, or other oxidizing gaseous moieties at elevated temperature known in the art. In addition to gaseous oxidizers, the term may also refer to treatment with strong oxidizing acids such as nitric and sulfuric acid or solid oxidizers such as potassium permanganate or chromic anhydride or other oxidizers known in the art.

As used herein, the term "H3 and N3 color centers" refers to specific crystallographic defect centers within the diamond lattice which can exhibit luminescence. More specifically, the H3 center refers to the specific defect center consisting of an atomic arrangement of two nitrogen atoms surrounding a vacancy which can exhibit green luminescence upon excitation with an appropriate source of electromagnetic radiation. More specifically, the N3 center refers to the specific defect center consisting of an atomic arrangement of three nitrogen atoms surrounding a vacancy which can exhibit blue luminescence upon excitation with an appropriate source of electromagnetic radiation.

As used herein, the term "synthetic and natural diamond particles" refers to diamond particle produced by either manmade methods or by non-manmade methods. More specifically, synthetic diamond particles refer to diamond particles produced by any of the known manmade methods of diamond synthesis; for example, high-pressure high-temperature synthesis, chemical vapor deposition synthesis, detonation synthesis, synthesis via laser ablation of a carbon substrate or other methods. More specifically, natural diamond particles consist of any diamond particle not produced by manmade methods; for example, diamonds formed under the Earth's crust, or diamonds formed as a result of a meteoric impact on the Earth's surface.

As used herein, the term "quantum properties" of diamond particles is related to spin characteristics of the NV centers including, but not limited to, the spin coherence time (T2), spin-lattice relaxation time (T1), optically detected magnetic resonance (ODMR) spectroscopic characteristics (sharpness of the peaks), ODMR contrast, and a difference in luminescence intensity of NV centers under applied magnetic field as compared to the luminescence intensity measurements without magnetic field. These characteristics can also include 13C dynamic nuclear polarization capability of P1 centers (single N dopants) at cryogenic temperature. Improvement in spin electronic and nuclear characteristics of color centers and spin-containing lattice elements is based on decrease of the lattice distortions at high temperature annealing and elimination of parasitic defects.

DRAWINGS

Now referring to the drawings, FIGS. 1a and 1b are an illustration of the spectra for 20-micron sized diamond particles with bluish fluorescence produced by the RTA annealing method at an annealing temperature of 1900° C. of diamond powders irradiated to a fluence of $5 \times 10^{19}$ e/cm². The outcome of annealing at 1900° C. is different for the as-irradiated and annealed at 1900° C. powder (1a) and the irradiated powder preliminary annealed at 850° C. (NV centers formed) followed up by RTA treatment at 1900° C. (1b). Excitation is around 380 nm.

FIG. 2 is illustration of the role of temperature in the RTA process in formation of (a) red luminescence after RTA treatment of irradiated diamond powder at 1250° C., (b) mixture of red and green luminescence after RTA treatment at 1600° C., (c) green luminescence after RTA treatment at about 1700° C., and (d) mixture of green and blue luminescence after RTA treatment at 2060° C. Provided are spectra of the 20 μm HPHT diamond powder irradiated at $1 \times 10^{19}$ e/cm² and RTA treated.

Figure 3:
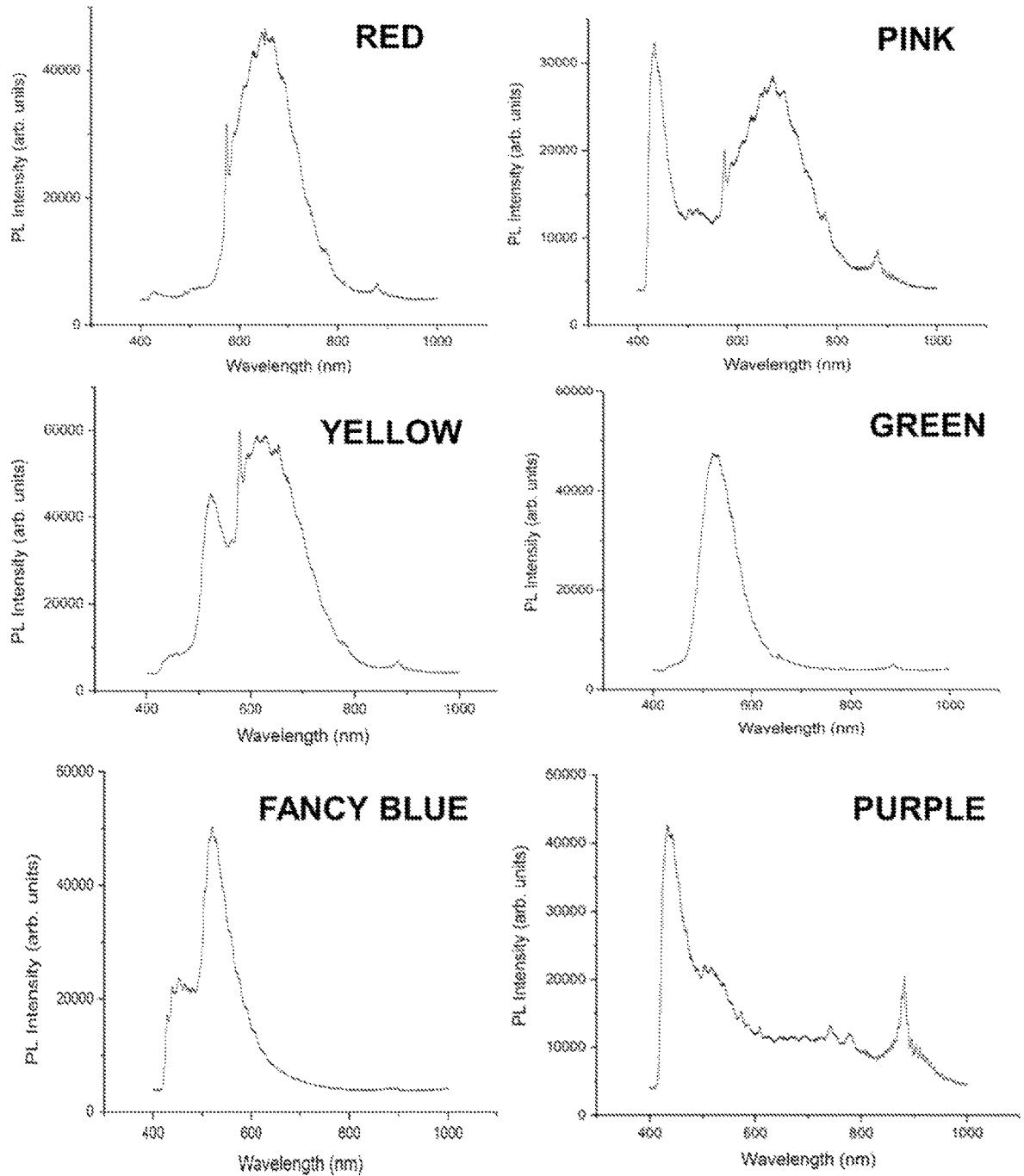
FIG. 3 is an illustration of the diversity of visual luminescence and PL spectra.

FIG. 3 is illustration of the diversity of visual luminescence and PL spectra of individual grains of 20 μm diamond particles under UV excitation. Examples are provided based on colors observed in prevailing or minor fractions of the particles following different annealing treatments. In addition to the specific luminescent colors shown in FIG. 3, other luminescent colors observed included orange, turquoise, and blue.

Figure 4:
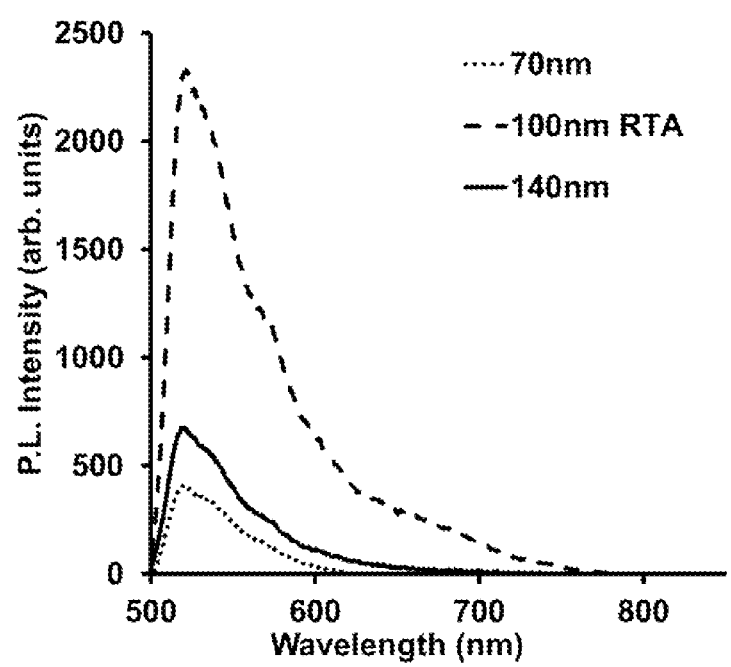
FIG. 4 is an illustration of fluorescent spectra of FND samples.

FIG. 4 is illustration of fluorescent spectra of FND samples with green fluorescence containing H3 centers. Samples 70 nm and 140 nm are produced from natural type Ia nanodiamond particles irradiated with 3 MeV electrons (70 nm particles) or He ions (140 nm) followed by annealing (800-900° C., 1-2 hours). The 100 nm sample is produced from type Ib synthetic diamond by irradiation with 3 MeV electrons followed by RTA at 1800° C. for 3 minutes. Excitation is 470 nm.

Figure 5:
FIG. 5 is an illustration of NIR PL.

FIG. 5 is illustration of NIR PL in 100 μm synthetic diamond powder with high N content (about 800 ppm) containing Ni treated by RTA at temperature 1900° C. for 5 minutes. Luminescent peaks at 730 nm, 750 nm, 776 nm, 808 nm, and 840 nm were observed. This NIR luminescence has been associated with metallic impurity atoms, for example, nickel, within the diamond lattice.

Figure 6:
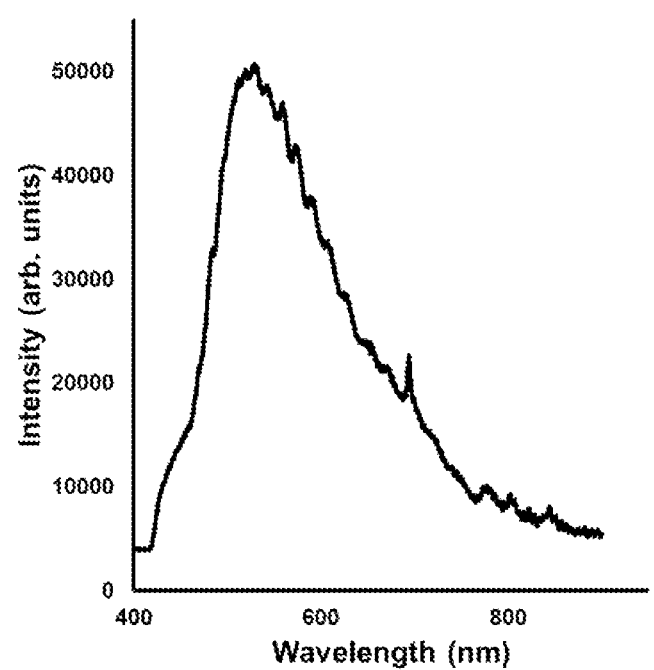
FIG. 6 is an illustration of strong green PL in CVD grown micro sized synthetic diamond powder.

FIG. 6 is illustration of strong green PL in CVD grown micron sized synthetic diamond powder doped with N, non-irradiated, treated by RTA at temperature 1800° C. for 5 minutes.

Figure 7A:
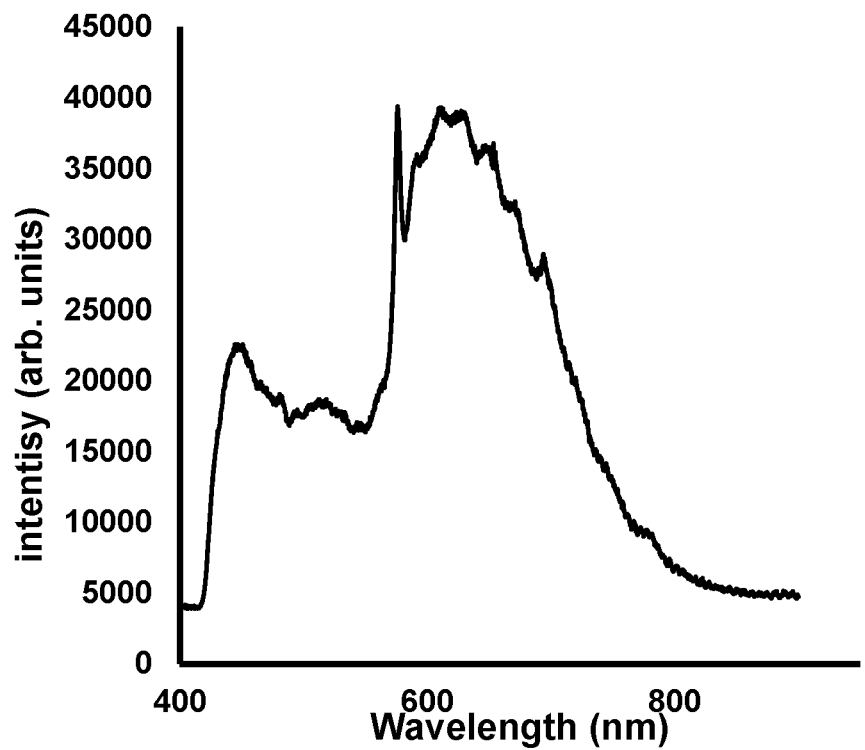
FIG. 7a and FIG. 7b show an illustration of strong green PL and combination of blue and red PL in CVD grown micron sized synthetic diamond powder under other conditions.
Figure 7B:
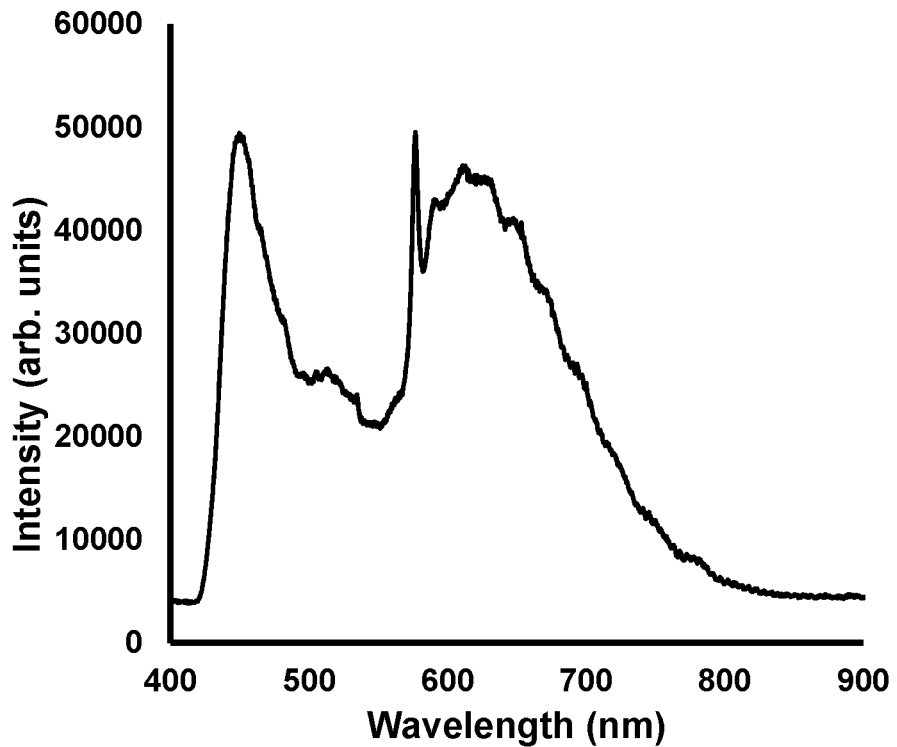

FIGS. 7a and 7b are an illustration of strong green PL in CVD grown micron sized synthetic diamond powder doped with N, non-irradiated, treated by RTA at temperature 1900° C. for 3 minutes (7a) and 2000° C. for 3 minutes (7b). Photoluminescent spectra are taken under laser excitation at 420 nm.

Figure 8:
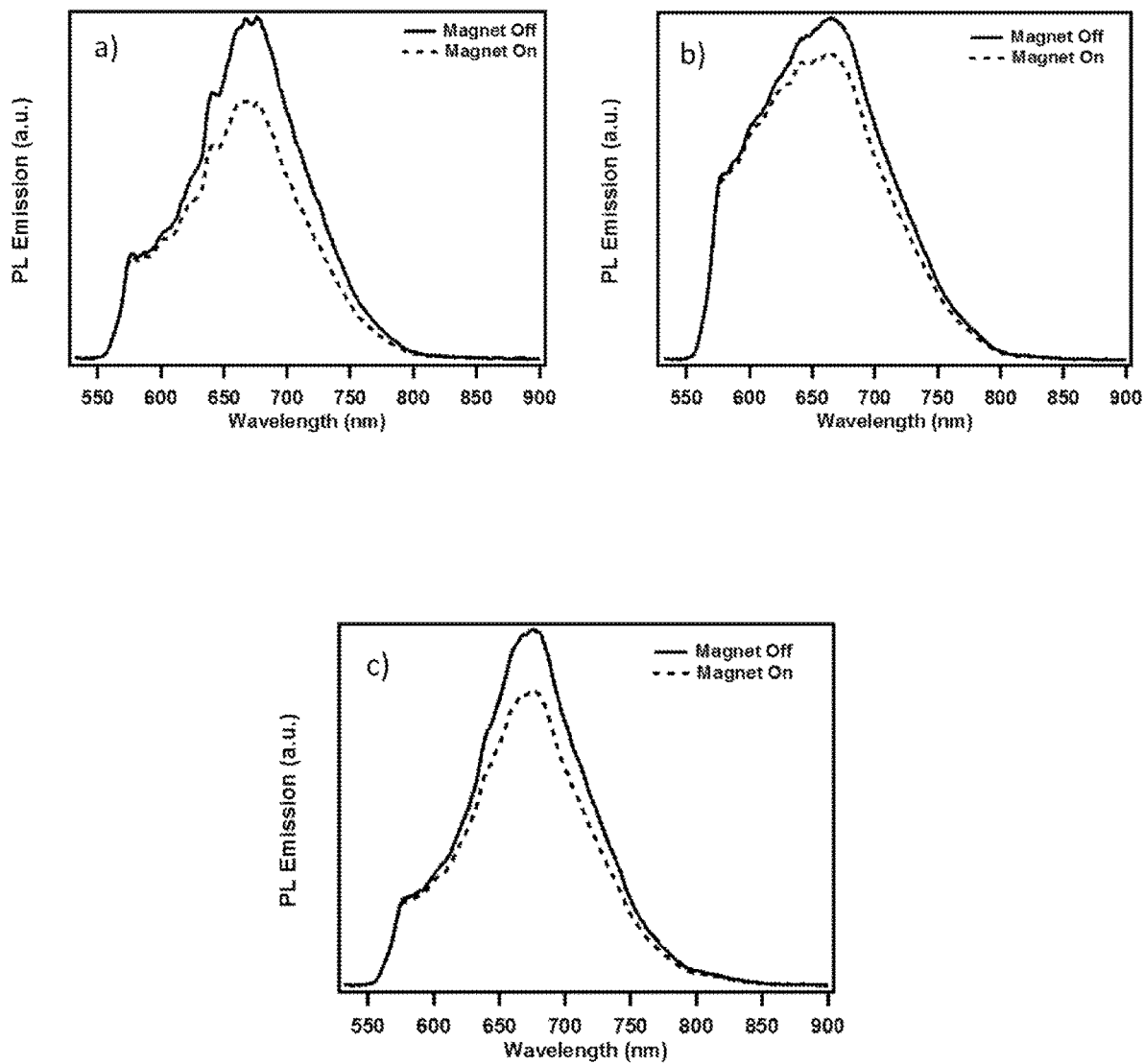
FIG. 8 is an illustration of changes in the PL spectra with and without applied magnetic field in diamond particles irradiated with electrons and treated at different annealing temperatures.

FIG. 8 is an illustration of difference in the reduction of PL intensity of NV centers by applying magnetic field about 1000 Gauss to the diamond powder for the following samples: irradiated to dose $1.5 \times 10^{19}$ e/cm² and annealed at 1740° C. for 8 min (a), irradiated to dose $1.5 \times 10^{19}$ e/cm² and annealed at 850° C. for 2 hours (b) and irradiated to dose $5 \times 10^{19}$ e/cm² and annealed at 1720° C. for 15 min (c). Photoluminescent spectra are taken under laser excitation at 532 nm.

Figure 9:
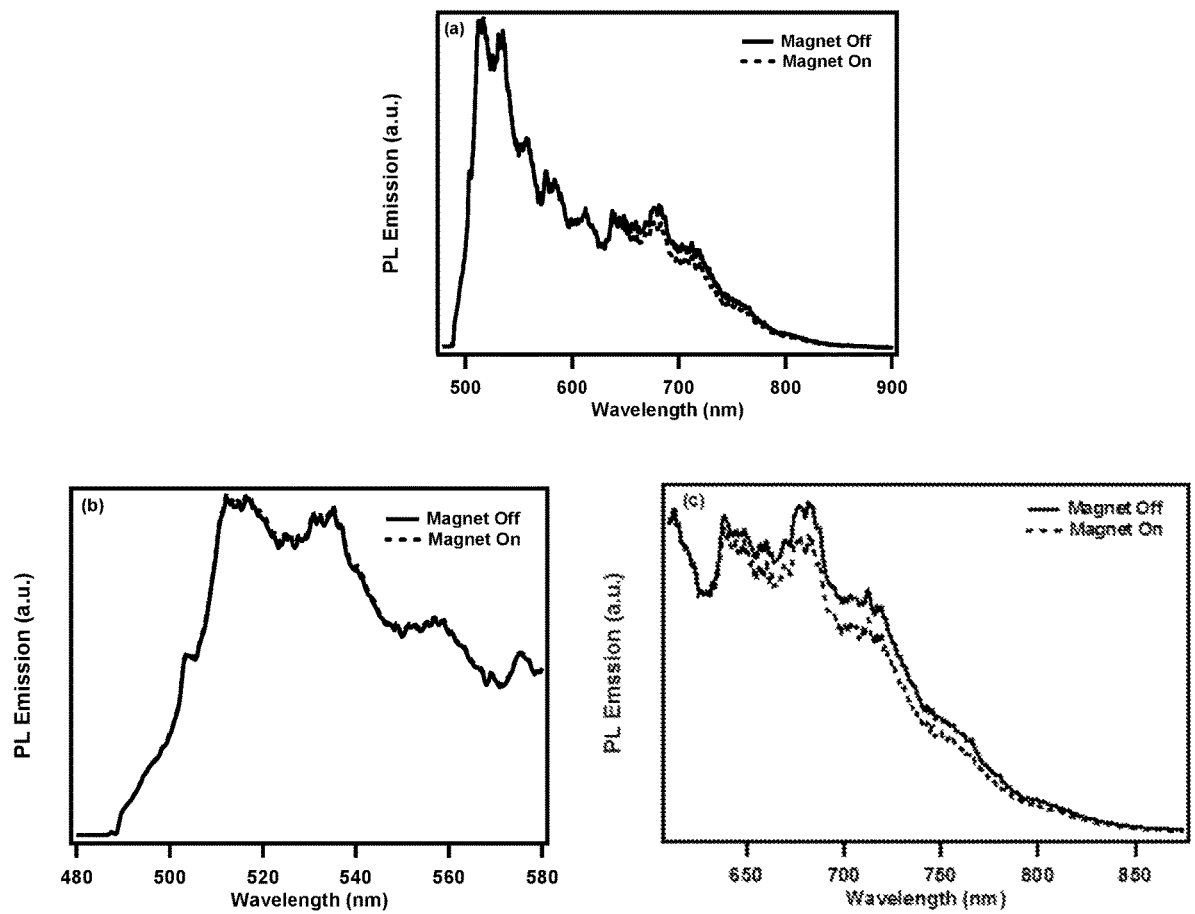
FIG. 9 is an illustration of changes in the ratio of PL intensity between NV and H3 centers with and without applied magnetic field in diamond particles containing simultaneously H3 and NV centers.

FIG. 9 is an Illustration of changes in the ratio of PL intensity between NV and H3 centers under applied magnetic field about 1000 Gauss to the diamond powder for the sample irradiated to dose $1.5 \times 10^{19}$ e/cm² and annealed at 1740° C. for 8 min. Emission spectra in the range of 500 nm to 900 nm is illustrated including spectra taken with magnetic field on and off (a). A larger scale spectra are provided for illustrating parts of the spectra for H3 emission (b) and NV emission (c). Photoluminescent spectra are taken under laser excitation at 488 nm.

EXAMPLES

Examples below provide details of the present approach and demonstrate the role of the parameters of the process that facilitate formation of specific types of luminescent centers in synthetic diamond such as annealing temperature, irradiation dose, annealing time, N concentration in the starting diamond powder, and presence of non-nitrogen dopant atoms.

The majority of rapid thermal annealing experiments illustrated below were performed using synthetic type Ib diamond powder synthesized by the HPHT method. Powder with average 20 μm particle sizes containing about 110 ppm of substitutional N according to EPR was purchased from Sandvik. These particles had irregular shapes as they were obtained by milling and grinding of larger grains. Powder 100 μm in size with high nitrogen content (high-N) was obtained from Sandvik and contained about 800 ppm of N, according to the vendor specifications. Other samples included HPHT diamond powder with as-grown grains having regular polyhedral shapes 150 μm, 40 μm and 25 μm in size purchased from Element 6. HPHT diamond powders with particle sizes 10 μm, 1 μm, and 100 nm were purchased from Kay Diamond. Particles of natural diamond milled to 1 μm size were purchased from Kay Diamond. Diamond powder produced from a mixture of graphite and hexogen with average primary particle sizes 10-15 nm tightly aggregated into 1 μm polycrystalline particles was purchased from Real-Dzerinsk, Russia. Diamond powder produced from a mixture of TNT and hexogen (detonated nanodiamond) with average primary particle sizes 5 nm forming strong aggregates 100 nm in size was purchased from Real-Dzerinsk, Russia. Diamond powder obtained from diamond films grown in a chemical vapor deposition reactor was also used in experiments.

The diamond powder samples were irradiated with a 1-3 MeV electron beam to different doses: $3\times10^{18}$ e/cm$^2$, $5\times10^{18}$ e/cm$^2$, $1\times10^{19}$ e/cm$^2$, $1.7\times10^{19}$ e/cm$^2$, or $5\times10^{19}$ e/cm$^2$, or other doses.

Typically the annealing was carried out in vacuum for 10 minutes from about 800° C. to 1800° C. and in hydrogen gas flow (P=1043 mbar) for the annealing in the temperature range of about 1800° C.-2200° C. A custom-made all-graphite furnace with a graphite sample container was used for the RTA experiments. The heating could be ramped up to the target temperature within minutes. Temperature was measured with an Omega thermocouple attached to the container. After the RTA treatment, samples underwent purification to remove the graphitic layer on the particles surfaces by annealing in a hydrogen atmosphere at 850° C. for about 10-15 minutes. Some samples were additionally purified from non-diamond carbon by heating at 500° C. in air for 2 hours. In the experiments below, the results are reported for the samples purified from the graphitic phase.

Photoluminescence measurements were performed at room temperature after annealing and purification. The analysis has been carried out using a Nikon Eclipse Ti-S Inverted Microscope and a Princeton Instruments Acton SP2150 Spectrometer with UV light from a mercury lamp as an excitation source. The PL spectra were analyzed using the Princeton Instruments LightField program. Additional spectroscopic analysis was performed using an Olympus IX71 inverted epifluorescent microscope using UV, blue, or green light provided from a mercury lamp and assembled with an Ocean Optics HR2000 USB spectrometer for spectroscopic measurements. Photographs of the samples under UV, blue, or green excitation were collected using the DS-Ri1 high-resolution microscope camera or the MT5000 (IFR) CCD microscope camera.

After each high temperature annealing step, both ensemble spectra and visual luminescence of the powder were analyzed, as well as characteristics of individual grains for micron sized powder. The optical centers of the diamond powder were detected over a broad spectral range covering wavelengths from 300 nm to 2000 nm. Different centers were distinguished in each sample by their characteristic zero-phonon lines (ZPL) and by their vibrational bands in luminescence.

Example 1. Rapid Thermal Annealing Experiments at 1900° C. Performed on as-Irradiated Powder and on Powder with an Intermediate Annealing after Irradiation HPHT commercial Ib type diamond powder with an average grain size of 20 μm was used in this study. The starting powder had a yellowish color in white light and very dim PL under excitation with UV, blue, or green light as observed in the fluorescent microscope. The powder was irradiated with 3 MeV electrons to a fluence of $5\times10^{19}$ e/cm$^2$ in order to induce radiation damage (to produce vacancies and self-interstitials and other possible irradiation defects). As-irradiated, the powder acquired a greenish color in white light due to the presence of irradiation defects. Green fluorescence under UV and blue excitation was detected in the FL microscope with peak intensity of the emission (around about 520 nm-530 nm), more than about 10× higher in comparison with the starting non-irradiated powder. This green fluorescence of the irradiated powder is associated with the irradiation defects and significantly diminishes after annealing at about 500° C. within 5 minutes.

In one set of experiments, a part of the irradiated powder first underwent post-irradiation annealing at 850° C. in vacuum for 2 hours in a Carbolite tube furnace, which is a well-known approach for production of NV centers. The powder acquired a pinkish color in white light and strong red fluorescence as seen in the FL microscope under green and blue excitation with a peak in the PL spectra at about 680 nm and characteristic ZPLs at 575 nm and 637 nm attributed to the presence of NV centers. Powder placed on a UV bench lamp also demonstrated strong red FL easily seen by naked eye. Then the powder was treated at 1900° C. using a RTA for 5 minutes in a hydrogen atmosphere. This sample is sample #1 in Table 1. After the RTA treatment, the powder still had a slight pinkish visual color in white light, but with less hue than the powder before RTA treatment. However, during inspection in the FL microscope, a non-homogeneous mixture of orangish, yellow, and green particles under UV excitation was seen. The PL spectra, correspondingly, demonstrated two dominant peaks under UV and blue excitation, in the green and red spectral ranges (e.g., under UV excitation the peaks were observed at about 520 nm and about 630 nm (FIG. 1b)).

Another part of the irradiated powder was treated at 1900° C. using RTA for 5 minutes in a hydrogen atmosphere without intermediate annealing (sample #2 in Table 1). After the RTA treatment, the powder surprisingly acquired a whitish appearance in white light and demonstrated very strong bluish luminescence after being placed on the UV bench lamp and illuminating with long wave UV light (about 360 nm) and shortwave UV light (about 280 nm). During inspection in the FL microscope, the particles revealed homogeneous bluish/greenish color under UV light with the dominating peak at 520 nm and well pronounced shoulder around 420 nm (FIG. 1a). No significant features attributed to NV centers are observed in the spectra of sample 2 (FIG. 1a).

Part of the powder of the irradiated and annealed at 850° C. sample was additionally annealed at 1400° C. for 1 hour in vacuum in the Carbolite furnace (sample #3 in Table 1). The sample remained pinkish in visual appearance and the dominant emission peak in the red spectral range was preserved. Spin-lattice relaxation time T1 of the NV centers in the sample as measured by EPR was prolonged by about two times.

The observed difference between samples 1 and 2 is very pronounced and is attributed to the formation of NV centers at temperatures 850° C. in sample 1 which is not possible to be annealed at 1900° C. and which, if formed, preclude obtaining uniform green\blue luminescent samples. This is directly related to the ramp up time during annealing. In the RTA experiments of the current approach, the ramp up and ramp down times are very short, about a minute, even for annealing at 2000° C. During "typical" annealing in a furnace, the ramp up rate is on the order of tens of degrees per minute. As we observed in the experiments described below, NV centers causing orange/red luminescence can be created within 5 minutes annealing time starting at temperatures of 700° C. and above. Therefore, fast ramp up time to the target temperature (in the current example 1900° C.) is critical for production of samples with homogeneous green\blue luminescence among the grains.

Example 2. Effect of Temperature at Rapid Thermal Annealing on Luminescence Colors of Treated Diamond Particles Commercial HPHT Ib type diamond powder with an average grain size of 20 μm was irradiated with 3 MeV electrons to a fluence of $1 \times 10^{19}$ e/cm$^2$ and treated with a series of rapid thermal annealing steps in the temperature range from about 800° C. to 2100° C.

Starting with the same diamond powder, significant changes in the visible luminescence color palette were observed depending on the temperature of RTA treatments. The initial 20 μm synthetic diamond powder has very low visible luminescence when exposed to UV, blue, or green excitation. After the electron beam irradiation, the powder shows pronounced green PL under UV excitation due to produced radiation defects. Irradiated powder was annealed at different temperatures in the range about 800° C.-1900° C. for 5 minute intervals. The duration of treatment at 2060° C. was only 3 minutes, since at 5 minute treatment, the powder was fully graphitized. At annealing below about 1500° C., the luminescence is orange/red under UV excitation (and red under green excitation). In the annealing temperature range between about 1500° C. and 1700° C., the luminescence of the powder demonstrates a transition from orange/yellowish to yellowish/green hues. Starting with the annealing temperature around 1700° C., the green luminescence starts to prevail as the annealing temperature increases. At temperatures above about 1900° C., a bluish hue appears. While visually diamond powder treated at temperature up to 1500° C. looks pinkish in white light, after treatment at higher temperatures it looks whitish, in agreement with a significant reduction of the concentration of NV centers present

TABLE 1

Experiments for evaluating the influence of rapid thermal annealing of HPHT powder performed at 1900° C. for 5 minutes for different history of treatment before RTA. A sample that has not undergone RTA treatment is provided for comparison. The intensity (arb. units) of maximum photoluminescence for powders taken with an Ocean Optics HR2000 USB spectrometer under green, blue, and UV excitation are provided. For measuring intensities, integration time is provided in brackets.

| # | Sample, pretreatment before RTA | RTA 1900° C., 5 min | Intensity, Green ex. (integ. time 100 ms) | Intensity, Blue ex. (integ. time 10 ms) | Intensity, UV ex. (integ. time 100 ms) |
|---|---|---|---|---|---|
| 1 | 20 μm, fluence 5E19 e/cm$^2$; annealed at 850° C. for 2 hrs | yes | ~3000 | ~1000 | ~1200 |
| 2 | 20 μm, fluence 5E19 e/cm$^2$ no intermediate annealing | yes | ~1000 | ~2600 | ~2600 |
| 3 | 20 μm, fluence 5E19 e/cm$^2$; annealed at 850° C. for 2 hrs; annealed at 1400° C. for 1 hrs | no | ~2000 | ~800 | ~800 |
| 4 | 20 μm non-irradiated | yes | low | low | low |

FIGS. 1a and 1b. Spectra for 20-micron sized diamond particles with bluish fluorescence produced by the RTA annealing method at an annealing temperature of 1900° C. of diamond powders irradiated to a fluence of $5 \times 10^{19}$ e/cm$^2$. The outcome of annealing at 1900° C. is different for the as-irradiated and annealed at 1900° C. powder (1a) and the irradiated powder preliminary annealed at 850° C. (NV centers formed) followed up by RTA treatment at 1900° C. (1b). Excitation is around 380 nm.

which are responsible for the pinkish visual appearance of diamond powder. FIG. 2 illustrates the corresponding ensemble photoluminescence spectra of the powders treated at a few different temperatures.

FIG. 2. Illustration of the role of temperature in the RTA process in formation of (a) red luminescence after RTA treatment of irradiated diamond powder at 1250° C., (b) mixture of red and green luminescence after RTA treatment at 1600° C., (c) green luminescence after RTA treatment at about 1700° C., and (d) mixture of green and blue luminescence after RTA treatment at 2060° C. Provided are spectra of the 20 μm HPHT diamond powder irradiated at $1\times10^{19}$ e/cm$^2$ and RTA treated.

While powders which have undergone specific RTA treatments show distinct luminescent colors, upon closer inspection using a fluorescent microscope inhomogeneity of luminescence among different grains can be clearly seen for certain temperature intervals of treatment, while for other intervals of treatment grains are much more homogeneous in luminescent color. This inhomogeneity is obvious in grains of starting as-purchased material and in the as-irradiated powder where, besides grains with dominating green luminescence, a minority of grains demonstrate other colors of luminescence such as orangish/red, pinkish, bluish, and purplish. Although the powder underwent electron irradiation with uniform fluence, the appearance of red and orange grains can be explained assuming that during the electron irradiation, a fraction of the powder was heated due to insufficient heat transfer so that NV centers responsible for these colors were generated during irradiation. Pinkish, bluish, and purplish luminescence can be attributed, possibly, to grains with locally enhanced N or metallic impurity content as compared to the majority of the grains. FIG. 3 summarizes the visual luminescence and PL spectra of few individual grains of 20 μm diamond particles under UV excitation. Examples are provided based on colors observed in prevailing or minor fractions of the particles after different annealing treatments to demonstrate the possible luminescent colors. Nine major colors of individual grains were observed under UV excitation, six are reported in FIG. 3 and its caption (red, pink, yellow, green, fancy blue, and purple), and other colors include orange, turquoise, and blue, but more variations in color within each group had been observed. Annealing at a temperature above about 1900° C. makes luminescence across different grains much more homogeneous.

FIG. 3. Illustration of the diversity of visual luminescence and PL spectra of individual grains of 20 μm diamond particles under UV excitation. Examples are provided based on colors observed in prevailing or minor fractions of the particles following different annealing treatments. In addition to the specific luminescent colors shown in FIG. 3, other luminescent colors observed included orange, turquoise, and blue.

Example 3. Effect of Duration of RTA on the Luminescence Colors

In another set of experiments, the 20 μm powder irradiated to $1.5\times10^{19}$ e/cm$^2$ fluence was annealed at 1700° C. for 50 minutes. Upon inspection using the fluorescent microscope under UV excitation, after this long annealing time at this temperature, the sample acquired a more pronounced blue hue as compared to greenish luminescence of the same sample annealed at 1900° C. for 5 minutes.

Example 4. Effect of e-Beam Irradiation Fluence on the Luminescence Colors

In this set of experiments, a comparison was made between 20 μm powders irradiated to $1.5\times10^{19}$ e/cm$^2$ and $5\times10^{19}$ e/cm$^2$ fluences. Irradiated powders were annealed by the RTA method in a hydrogen atmosphere at 1900° C. for 5 minutes. Powder irradiated to $5\times10^{19}$ e/cm$^2$ fluence showed bluish/whitish luminescence well distinguished from the greenish luminescence of the powders irradiated to $1.5\times10^{19}$ e/cm$^2$ fluence when both powder samples underwent similar RTA treatment.

Example 5. RTA Experiments on 100 nm Irradiated Synthetic Diamond Powder

In a set of experiments, the RTA was performed on 100 nm HPHT type Ib particles irradiated to $1\times10^{19}$ e/cm$^2$ fluence. Sample was purified from sp$^2$ carbon and impurities by oxidation in acids before the RTA annealing. Then the powder was treated by RTA in a hydrogen atmosphere at 1900° C. for 1 minute. As expected, graphitization of 100 nm particles was significantly higher than for 20 μm particles at 1900° C. After the RTA treatment, the powder was purified by etching in hydrogen and oxidation in air for 5 hours at 500° C. to remove the graphitic shell formed during the RTA treatment. The green luminescence obtained in the type Ib 100 nm diamond particles was significantly brighter than green luminescence in natural diamond particles of similar sizes produced in currently used commercial production processes involving irradiation with high energy particles, followed by annealing at 850° C. and purification (FIG. 4).

FIG. 4. Fluorescent spectra of FND samples with green fluorescence containing H3 centers. Samples 70 nm and 140 nm are produced from natural type Ia nanodiamond particles irradiated with 3 MeV electrons (70 nm particles) or He ions (140 nm) followed by annealing (800-900° C., 1-2 hours). The 100 nm sample is produced from type Ib synthetic diamond by irradiation with 3 MeV electrons followed by RTA at 1800° C. for 3 minutes. Excitation is 470 nm.

RTA annealing of 100 nm powder was also performed at 1700° C. for 5 minutes in hydrogen atmosphere. After purification from non-diamond carbon, the powder had uniform visual yellow luminescence under blue excitation. Its spectroscopic signature demonstrated presence of H3 and NV centers simultaneously causing yellow visual luminescence by mixing green and red luminescence from the centers.

Example 6. RTA of High-N Synthetic Diamond Powder

RTA experiments were performed using 100 μm synthetic diamond particles with high nitrogen (high-N), containing about 800 ppm of N and also Ni dopants. RTA at 1900° C. was done for 5 minutes for a sample irradiated to $3\times10^{18}$ e/cm$^2$ fluence. The sample acquired bright green luminescence.

Appreciable green luminescence was also obtained for the RTA treated non-irradiated sample. The intensity of fluorescence was more pronounced than for non-irradiated type Ib powder containing about 110 ppm of N. It should be noted, however, that the high-N sample contained an appreciable amount of magnetic impurities (e.g. Ni), twice higher according to EPR characterization than the Ib type samples in the examples above. The presence of Ni contributes to production of bright green fluorescence in diamond by RTA. Luminescent centers emitting in the 700 nm-900 nm range have been also observed in these samples (FIG. 5) and can be attributed to Ni impurities.

FIG. 5. Illustration of NIR PL in 100 μm synthetic diamond powder with high N content (about 800 ppm) containing Ni treated by RTA at temperature 1900° C. for 5 minutes. Luminescent peaks at 730 nm, 750 nm, 776 nm, 808 nm, and 840 nm were observed. This NIR luminescence has been associated with metallic impurity atoms, for example, nickel, within the diamond lattice.

Example 7. Produced Color Centers Based on Photoluminescence Spectra

Samples were produced as described in examples 1 to 3 and their PL spectra analyzed in terms of corresponding color centers. Photoluminescence (PL) spectra of samples produced by electron irradiation and annealing in the temperature range 500° C. to 2200° C. containing combinations of different types of luminescent color centers depending on the treatment conditions are as following: (i) centers caused by irradiation (GR1, TR12 and 3H centers), (ii) nitrogen-related centers caused by the aggregation of nitrogen impurities with other nitrogen atoms or/and with vacancies (NV, H3, N3), and (iii) nickel-related centers with a specific peak in the near-infrared (NIR) region and also a contribution to the broad emission in the about 500 nm-560 nm region. Optical centers observed in the PL spectra are summarized in Table 2.

A dominant center typically formed in type Ib synthetic diamond is a NV center, in both neutral (NV0) and negatively charged state (NV−), with ZPL at 575 nm and 637 nm, correspondingly. A UV source excites NV0 centers more efficiently than NV− centers, so the 575 nm ZPL is well pronounced in spectra of the annealed samples under UV illumination. ZPL at 637 nm is well distinguished under blue and green excitation. In the as-irradiated samples, the ZPL attributed to NV0 center can be found in a small fraction of grains which during electron irradiation acquired a temperature high enough for vacancies diffusion. The NV centers are present in a minority of grains after thermal treatments at 500° C., 600° C., and 700° C. After the annealing at 800° C., the NV0 center became the dominate feature in the PL spectra with a ZPL at 575 nm under UV excitation and is present after annealing at temperatures from 900° C. to 1700° C., demonstrating the very high thermal stability of the NV0 center. Interestingly, the ZPL at 637 nm attributed to negatively charged NV centers was observed under green excitation in samples annealed at 1900° C. demonstrating the high thermal stability of this center also.

TABLE 2

Key defect centers observed, their designation, and description.

| Defect Center Designation | Type | Description | PL Characteristics |
| --- | --- | --- | --- |
| 3H | Radiation Induced | Intrinsic interstitial defect | 488, 503, 518 nm peaks |
| TR12 | Radiation Induced | Two vacancies and two interstitial carbons | Broad peak centered around 466 nm |
| GR1 | Radiation Induced | Neutral vacancy | 740 nm peak |
| NV | Impurity-Vacancy Complex | Nitrogen-vacancy pair (can be neutral or negatively charged) | 575 nm, 638 nm, broad emission from 570-800 nm |
| Ni-related center | Impurity Related | Ni-related | 879 nm |
| H3 (NVN) | Impurity-Vacancy complex | Two nitrogen and single vacancy complex | 503 ZPL, 500-530 broad peak |
| N3 | Impurity-Vacancy complex | Three nitrogen and single vacancy complex | 420-480 nm features |

PL spectra of the samples after the electron irradiation contain features related to TR12, 3H, and GR1 centers that are characteristic intrinsic radiation centers. Broad peaks centered at 466 nm and 740 nm are attributed respectively to TR12 centers (a defect involving two vacancies and two interstitial carbon atoms) and GR1 centers (isolated neutral vacancies). TR12 and GR1 centers are present after thermal treatment at 500° C., 600° C., and 700° C. Annealing at 800° C. for 15 minutes results in complete elimination of GR1 centers whereas the TR12 centers can still be present. The 3H center is present in the PL spectra of some irradiated grains as an intense band with peaks at 488 nm-503 nm-518 nm but annealing at 500° C. for 15 minutes eliminates peaks related to this center in the PL spectra. 3H center relates to an intrinsic defect containing interstitials, therefore its temperature stability is low. Electron paramagnetic resonance (EPR) studies demonstrated that the irradiated 20 µm HPHT diamond powder also contains negatively charged vacancies, interstitials (R1/R2 centers), and substitutional N (P1 centers), the latter in a reduced amount as compared to the starting material (e.g., 45 ppm of P1 centers detected after irradiation at $1 \times 10^{19}$ e/cm$^2$ fluence versus 110 ppm in the starting material).

At annealing temperatures starting at about 1500° C., the formation of another nitrogen-related defect, the H3 center responsible for green luminescence, becomes pronounced. The 520 nm peak in the PL spectra can be attributed to this defect. For treatments starting at about 1700° C. and above, H3-related peak becomes dominant in the PL spectra.

Annealing at temperature above about 1800° C. results in the formation of N3 centers. Spectroscopic features around 420 nm to 480 nm range characteristic for this center are present in the spectra after annealing in the temperature range from about 1800° C. to 2200° C.

Beside the nitrogen-related centers, another impurity-related center that was detected in the studied samples is a nickel center which results in a broad and very intense band centered at 879 nm. The Ni-related center is the major characteristic of the PL spectrum of the as-grown diamond powder. Ni atoms were incorporated in the resulting crystal during the HPHT growth process in which transition metal alloys containing, for example, manganese, iron, nickel, and cobalt are used as catalysts. After the electron irradiation, this band is reduced in intensity. The Ni-related band is still present and prominent after thermal annealing at temperature of 500° C. and 600° C., but significantly suppressed in the ensemble spectra of powders after the annealing at 700° C. and higher temperatures, while this NIR peak can be observed as a well pronounced peak in individual grains presumably enriched with Ni related centers in the diamond lattice. It can be assumed that the annealing at temperatures higher than 800° C. causes the nickel impurities to aggregate with other defects. It can be also assumed that nickel and nitrogen impurities could interact with each other to form complexes consisting of nickel, nitrogen, and a vacancy.

Example 8. RTA of CVD Diamond Particles

Two polycrystalline diamond films grown by chemical vapor deposition and doped with N during growth had been treated by RTA. Concentration of N in the samples varied between approximately 10 ppm and 20 ppm. Sample with lower N content is called sample 8.1 and the sample with higher N content is called sample 8.2. Films were not irradiated. Grain sizes in the films were between about 1 μm and 20 μm as seen in images taken in optical microscope. Surprisingly, after RTA treatment followed by purification in hydrogen and oxidizing atmosphere, the films fractionated into individual grains, as was seen in a fluorescent microscope. FIG. 6 illustrates PL spectra for the sample 8.1 treated at 1800° C. for 5 minutes exhibiting strong green PL. FIG. 7 illustrates spectra for the sample 8.2 treated at 1900° C. for 3 minutes (FIG. 7a) and 2000° C. for 3 minutes (FIG. 7b) exhibiting a combination of pronounced blue and red fluorescence. Higher treatment temperature (FIG. 7b) results in more pronounced blue fluorescence as compared to RTA treatment at a lower temperature (FIG. 7a).

FIG. 6. Illustration of strong green PL in CVD grown micron sized synthetic diamond powder doped with N, non-irradiated, treated by RTA at temperature 1800° C. for 5 minutes.

FIGS. 7a and 7b. Illustration of strong green PL in CVD grown micron sized synthetic diamond powder doped with N, non-irradiated, treated by RTA at temperature 1900° C. for 3 minutes (a) and 2000° C. for 3 minutes (b). Photoluminescent spectra are taken under laser excitation at 420 nm.

The Examples above demonstrate the production of a plurality of luminescent diamond particles exhibiting luminescence in specific selected spectral ranges such as, for example, NIR, red, green, and blue ranges. Production of luminescent diamond particles is accomplished starting with type Ib synthetic diamond powder or CVD diamond films with reproducible properties, irradiating the diamond powder or CVD films with high energy electrons, and performing rapid thermal annealing to control diffusion of vacancies/interstitials created by irradiation and intrinsic doping elements (N and other impurity elements) for formation of desirable color centers by choosing the selected annealing temperature. As the annealing temperature and time are used to control diffusion of vacancies/interstitials and intrinsic doping elements, other known methods of rapid annealing, such as laser annealing, wave heating, heat produced during combustion, detonation, or explosion, or other heating methods not known at this time, could be used for rapid annealing to produce diamond particles exhibiting luminescence in specific selected spectral ranges.

In addition to the production of diamond particles with multicolor capability, annealing the irradiated diamond particles at a target temperature in the temperature range from about 1400° C. to about 2200° C. improves quantum properties of the NV centers formed in the particles including, but not limited to, the spin coherence time, spin-lattice relaxation time, and optically detected magnetic resonance (ODMR) characteristics. T1 and T2 times under annealing temperatures exceeding approximately 1400° C. can be prolonged at least two times and is expected to be prolonged 4 times and up to an order of a magnitude as measured by EPR and other known methods in the art. A difference in luminescence intensity of NV centers under applied magnetic field as compared to the luminescence intensity measurements without magnetic field for samples annealed at temperature above about 1400° C. is also increased in comparison with samples annealed at standard conditions (850° C.), as illustrated in the examples below.

Example 9. Luminescence Intensity of the NV Centers with and without Magnetic Field for RTA Treated Particles Diamond particles with average size 15 um were irradiated to dose $1.5 \times 10^{19}$ e/cm$^2$ and annealed under RTA conditions at 1740° C. for 8 min (sample A) and at 850° C. for 2 hours (sample B). Another sample with average particles size 15 um was irradiated to dose $5 \times 10^{19}$ e/cm$^2$ and annealed under RTA conditions at 1720° C. for 15 min (sample C). Emission spectra of the samples were taken under green excitation (laser 532 nm) (FIG. 8). It is known that applying magnetic field to diamond particles containing NV centers cause decrease in their luminescence intensity. A stack of magnetic disks made of NdFeB, Grade N42 (K&J Magnetics, Inc.), with surface field more than about 1000 Gauss was brought to close proximity of the diamond powder and emission spectra were taken again. It was very surprising that the difference in luminescence intensity of the samples A and C treated at temperature exceeding 1700° C. by applying the magnetic field significantly exceeded the difference for the sample B treated at conventional annealing (850° C.). The difference of the peak intensities with/without magnet was 25% for sample A, about 18% for sample C, and about 9% for sample B (see FIG. 8). These properties of RTA treated samples are beneficial for imaging in the conditions of high fluorescent background by modulating the fluorescence intensity by magnetic field and performing image subtraction to reduce the background noise.

FIG. 8. Illustration of the difference in the reduction of PL intensity of NV centers by applying magnetic field about 1000 Gauss to the diamond powder for the following samples: irradiated to dose $1.5 \times 10^{19}$ e/cm$^2$ and annealed at 1740° C. for 8 min (a), irradiated to dose $1.5 \times 10^{19}$ e/cm$^2$ and annealed at 850° C. for 2 hours (b), and irradiated to dose $5 \times 10^{19}$ e/cm$^2$ and annealed at 1720° C. for 15 min (c). Photoluminescent spectra are taken under laser excitation at 532 nm.

Example 10. Ratio Between PL Intensity of H3 Centers and NV Centers with and without Magnetic Field for RTA Treated Particles Samples from the example 9 treated under RTA (samples A and C) have well pronounced peaks in PL spectra both from both NV and H3 centers (see FIG. 9 illustrating emission spectra for sample A from example 9). The sample treated at regular annealing (sample B) does not contain an appreciable peak related to H3 centers in its spectra. By exciting the sample A with a blue laser, it was possible to detect the maximum in PL intensity of H3 centers (~520 nm) and NV centers (~680 nm) and estimate a ratio between the maxima (~2.25). Spectra of FIG. 9 also contain background peaks attributed to autofluorescence of the beam splitter used in this experiment. By applying the magnet with surface field about 1000 Gauss brought into a close proximity of the particles, it was possible to reduce the PL intensity of the NV centers by about 10% (FIG. 9a, c) while the intensity of H3 centers was not changed (FIG. 9a, b). The ratio between peak maxima for H3 and NV centers in the presence of magnetic field in this case was 2.49. This self-calibration of samples with dual color emission and capability to change the emission of NV centers using a modulated magnetic field can be specifically useful for FDP imaging in conditions of quickly changing fluorescent background.

FIG. 9. Illustration of changes in the ratio of PL intensity between NV and H3 centers under applied magnetic field about 1000 Gauss to the diamond powder for the sample irradiated to dose $1.5\times10^{19}$ e/cm$^2$ and annealed at 1740° C. for 8 min. Emission spectra in the range of 500 nm to 900 nm is illustrated including spectra taken with magnetic field on and off (a). Larger scale spectra are provided for illustrating parts of the spectra for H3 emission (b) and NV emission (c). Photoluminescent spectra are taken under laser excitation at 488 nm.

It is expected that multicolor diamonds will find broad industrial and biomedical applications. Multicolor capability makes fluorescent nanodiamonds a multicolor platform material comparable in this capacity with organic dyes and quantum dots yet exceeding them in photostability and lack of toxicity in bioimaging applications. Moreover, the combination of different color centers within single particles is also possible, extending the color palette of FND to more than three colors. Importantly, groups of FND containing NV, or H3, or N3 centers have the capability to be excited by UV for simultaneous, multiplexed detection, or by two-photon excitation between about 700 nm-1100 nm, which are optimum wavelengths for tissue penetration and reduction of background fluorescence.

Significantly improved quantum properties of NV centers in diamond particles treated at temperature exceeding approximately 1400° C., according to the present invention, make them more robust in sensing applications such as sensing of changes in temperature, magnetic and electric field, strain and stress, presence of external electronic and nuclear spins, free radicals, and sensing changes in environment such as, for example, pH. Surprisingly strong modulation of PL by magnetic field for diamond particles containing NV and H3 centers can be also beneficial for applications of diamond particles in authentication, labeling, identification, anti-counterfeiting and brand protection. Particularly appealing for these applications is prolongation of T1 and T2 times more than twice and up to an order of magnitude as compared to diamond particles treated at conventional annealing conditions after irradiation with energetic species. Application of diamond particles in quantum information technologies and quantum cryptography would also benefit from prolongation of T2 characteristic of the NV centers due to annealing at temperature exceeding approximately 1400° C. and more specifically 1700° C. Content of NV centers in diamond with improved quantum properties can vary between about 1 ppm and 10 ppm. In certain embodiments of the present invention along with NV centers particles may contain plurality of H3 centers and other types of fluorescent centers.

Those skilled in the art to which the present invention pertains may make modifications resulting in other embodiments employing principles of the present invention without departing from its spirit or characteristics, particularly upon considering the foregoing teachings. Accordingly, the described embodiments are to be considered in all respects only as illustrative, and not restrictive, and the scope of the present invention is, therefore, indicated by the appended claims rather than by the foregoing description or drawings. Consequently, while the present invention has been described with reference to particular embodiments, modifications of structure, sequence, materials, and the like apparent to those skilled in the art still fall within the scope of the invention as claimed by the applicant.

What is claimed is:

1. A method of processing diamond particles to form a plurality of luminescent diamond particles exhibiting luminescence in specific selected spectral ranges, comprising:
   a. providing diamond particles with sizes below about 100 microns having a surface and a diamond lattice and containing a plurality of impurity atoms in the diamond lattice;
   b. irradiating the diamond particles with high energy species in a dose of about $1\times10^{10}$ species/cm$^2$ to $1\times10^{21}$ species/cm$^2$;
   c. annealing the irradiated diamond particles in at least one of an inert gas environment, vacuum, or hydrogen environment at a target temperature in the temperature range from about 1400° C. to about 2200° C. to form luminescent diamond particles with emission in the specific selected spectral range where the specific spectral range is controlled by the temperature and duration of the annealing process and the irradiation dose;
   d. purifying the irradiated and annealed diamond particles to remove sp$^2$ carbon from the surface of the diamond particles; and
   e. where the luminescence is excited by electromagnetic radiation in the wavelength range comprising at least one selected from the group consisting of optical and X-ray radiation.

2. The method of processing diamond particles to form luminescent diamond particles according to claim 1, wherein the specific selected spectral ranges correspond to emission spectral ranges of at least one of the luminescent centers formed by an impurity atom and a vacancy; at least two impurity atoms and a vacancy; and a combination thereof.

3. The method of processing diamond particles to form luminescent diamond particles according to claim 1, wherein the luminescence is excited by optical radiation comprising wavelengths from the range about 190 nm to 2000 nm.

4. The method of processing diamond particles to form luminescent diamond particles according to claim 1, wherein the impurity atoms are N atoms and the target temperature facilitates the formation of a plurality of H3 luminescent color centers.

5. The method of processing diamond particles to form color centers according to claim 4, wherein the target temperature is a temperature above about 1700° C.

6. The method of processing diamond particles to form luminescent diamond particles according to claim 1, wherein the impurity atoms are N atoms and the target temperature is selected to cause the formation of a plurality of N3 luminescent color centers.

7. The method of processing diamond particles to form color centers according to claim 6, wherein the target temperature is a temperature above about 1900° C.

8. The method of processing diamond particles to form luminescent diamond particles according to claim 1, wherein the target temperature facilitates the formation of a plurality of nickel-containing luminescent color centers.

9. The method of processing diamond particles to form luminescent diamond particles according to claim 1, wherein the diamond particles contain less than about 200 ppm of nitrogen.

10. The method of processing diamond particles to form luminescent diamond particles according to claim 1, wherein the diamond particles comprise particles produced by at least one of the methods selected from the group consisting of detonation, shock wave, chemical vapor deposition, laser ablation, ultrasonic treatment, nucleation of diamond powder in the gas phase, ion irradiation of graphite, chlorination of carbides, high-pressure-high-temperature diamond synthesis and fragmentation of synthetic, or natural bulk diamond.

11. The method of processing diamond particles to form luminescent diamond particles according to claim 1, wherein the irradiating comprises at least one species selected from the group consisting of irradiating with high energy electrons, protons, ions, neutrons, and gamma rays.

12. The method of processing diamond particles to form luminescent diamond particles according to claim 1, further comprising:
functionalizing the purified diamond particles with at least one functional group selected from the group consisting of carboxylic, hydroxyl, amino, hydrogen, epoxy, polyethylene glycol, hydrocarbon chain, hydrocarbon, aromatic, nucleophile, thiol, sulfur, acid, base, halogen and fluoro-containing.

13. The method of processing diamond particles to form luminescent diamond particles according to claim 1, further comprising:
after the purification from $sp^2$ carbon, conjugating with the diamond particles or attaching to the diamond particles at least one material selected from the group consisting of biological molecules, a nucleic acid, a protein, an antibody, a ligand, a dye, a fluorescent specie, a radioactive specie, a paramagnetic specie, an image contrast agent, an isotope, a drug molecule, and a polymer.

14. The method of processing diamond particles to form luminescent diamond particles according to claim 1, further comprising incorporation of the luminescent diamond particles into a cell, organism, tissue, matrix or a substrate.

15. The method of processing diamond particles to form luminescent diamond particles according to claim 1, wherein the impurity is selected from the group consisting of N, Ni, Co, a transition metal, non-carbon isotope, 19F, 15N, a rare earth element, a noble gas atom, Sn, Ag, Tl, Zn, Si, and Ge.

16. The method of processing diamond particles to form luminescent diamond particles according to claim 1, wherein the irradiating comprises irradiating with electrons having energy between about 300 keV and about 10 MeV providing irradiation dose between about $1\times10^{16}$ e/cm$^2$ to $1\times10^{21}$ e/cm$^2$.

17. The method of processing diamond particles to form luminescent diamond particles according to claim 1, wherein the target temperature is selected to cause the formation of at least one of NV, H3, N3, SiV, Ni-containing luminescent color centers, and a mixture thereof.

18. The method of processing diamond particles to form luminescent diamond particles according to claim 1, further comprising after the step b) annealing the irradiated diamond particles in at least one of an inert gas environment, vacuum, or hydrogen environment at a target temperature below approximately 1400° C. and then performing steps c) and d).

19. A plurality of luminescent diamond particles with sizes below about 100 microns having a surface and a diamond lattice and containing nitrogen dopant atoms at concentration below about 200 ppm and at least one non-nitrogen dopant atom, where particles contain a plurality of at least one of H3 centers, N3 centers, a non-nitrogen dopant atom related luminescent center, and a mixture of the thereof.

20. A plurality of luminescent diamond particles according to claim 19, further comprising NV centers.

21. A plurality of luminescent diamond particles according to claim 19, wherein the non-nitrogen dopant is selected from the group consisting of Ni, Co, a transition metal, carbon isotope, 13C, non-carbon isotope, 19F, 15N, a rare earth element, a noble gas atom, Sn, Ag, Tl, Zn, Si, and Ge.

22. A plurality of luminescent diamond particles according to claims 1 and 19, wherein the concentration of nitrogen dopant atoms is below about 100 ppm.

23. A plurality of luminescent diamond particles according to claims 1 and 19, wherein the concentration of nitrogen dopant atoms is below about 50 ppm.

24. The method of processing diamond particles to form color centers according to claim 1, wherein annealing is done in a hydrogen environment and the total duration of the combination of ramp up time, annealing time at the target temperature, and the ramp down time is about 30 minutes or less.

25. The method of processing diamond particles to form luminescent diamond particles according to claim 1, wherein the luminescence is excited by X-ray radiation comprising wavelengths from the range about 0.01 nm to about 10 nm.

26. The method of processing diamond particles to form luminescent diamond particles according to claim 9, further comprising while exciting luminescence by electromagnetic radiation, applying a magnetic field to the particles and monitoring difference in luminescence intensity in the specific spectral range corresponding to the emission of NV centers as compared to the luminescence intensity measurements without magnetic field by at least one of the modes: spectroscopically and using an imaging device.

27. The method of processing diamond particles according to claim 26 where the difference in luminescence intensity is more than approximately 5% for at least one emission wavelength from the specific spectral range corresponding to the emission of NV centers.

28. A plurality of luminescent diamond particles with sizes below about 100 microns having a surface and a diamond lattice and containing nitrogen dopant atoms at concentration below about 100 ppm, where the particles contain a plurality of NV centers and H3 centers and where a difference in the luminescence intensity for at least one wavelength from the specific spectral range corresponding to the emission of NV centers measured in the presence and absence of a magnetic field comprises more than about 5%.

29. The plurality of luminescent diamond particles according to claim 28, wherein the particles containing a plurality of NV centers and H3 centers demonstrate the difference in the emission luminescence intensity in the absence or presence of the magnetic field for the field of at least about 100 Gauss.

30. The plurality of luminescent diamond particles according to claim 28, where the ratio between the maximum luminescent intensity for H3 centers and maximum luminescence intensity for NV centers is different in the presence and absence of a magnetic field.

31. The plurality of luminescent diamond particles according to claim 28, where the luminescence is excited by wavelengths from UV to NIR spectral regions.

32. The plurality of luminescent diamond particles according to claim 28, further comprising the luminescent diamond particles combined with a cell, organism, organ, tissue, fluid, matrix, or a substrate.

33. The plurality of luminescent diamond particles according to claim 32, where the substrate is electronic component, a tag, a tracer, a label, a polymer, and an optically transparent solid.

34. The method of processing diamond particles to form luminescent diamond particles according to claim 1, wherein the step b) is omitted.

35. The method of processing diamond particles to form luminescent diamond particles according to claim 1, wherein diamond particles are enriched with 13C.

\* \* \* \* \*